United States Patent
Li

(10) Patent No.: US 10,956,827 B2
(45) Date of Patent: Mar. 23, 2021

(54) METHODS OF CONSTRUCTING AND DESIGNING RF PULSES AND EXCITING OR INVERTING TWO-LEVEL SYSTEMS

(71) Applicant: Jr-Shin Li, St. Louis, MO (US)

(72) Inventor: Jr-Shin Li, St. Louis, MO (US)

(73) Assignee: Washington University, St. Louis, MO (US)

( * ) Notice: Subject to any disclaimer, the term of this patent is extended or adjusted under 35 U.S.C. 154(b) by 461 days.

(21) Appl. No.: 16/008,747

(22) Filed: Jun. 14, 2018

(65) Prior Publication Data

US 2018/0365584 A1 Dec. 20, 2018

Related U.S. Application Data

(60) Provisional application No. 62/519,859, filed on Jun. 14, 2017.

(51) Int. Cl.
| | |
|---|---|
| *G06N 10/00* | (2019.01) |
| *G01R 33/36* | (2006.01) |
| *G01R 33/46* | (2006.01) |
| *G01N 24/08* | (2006.01) |

(52) U.S. Cl.
CPC ............ *G06N 10/00* (2019.01); *G01R 33/36* (2013.01); *G01R 33/4616* (2013.01); *G01N 24/087* (2013.01)

(58) Field of Classification Search
CPC .... G01R 33/36; G01R 33/4616; G06N 10/00; G01N 24/087
See application file for complete search history.

(56) References Cited

U.S. PATENT DOCUMENTS

| | | | |
|---|---|---|---|
| 2014/0303478 A1* | 10/2014 | Roche | G01R 33/5608 600/410 |
| 2017/0176562 A1* | 6/2017 | Li | G01R 33/5617 |
| 2018/0017700 A1* | 1/2018 | Shin | E21B 47/13 |

OTHER PUBLICATIONS

Braun et al. (2014), Concurrently Optimized Cooperative Pulses in Robust Quantum Control: Application to Broadband Ramsey-Type Pulse Sequence Elements, New Journal of Physics, vol. 16, Article No. 115002.
Cory et al. (1997), Ensemble Quantum Computing by NMR Spectroscopy, PNAS, vol. 94, pp. 1634-1639.
Frueh et al. (2005), Sensitivity Enhancement in NMR of Macromolecules by Application of Optimal Control Theory, Journal of Biomolecular NMR, vol. 32, pp. 23-30.
Glaser et. al. (1998), Unitary Control in Quantum Ensembles, Maximizing Signal Intensity in Coherent Spectroscopy, Science, vol. 280, pp. 421-424.
Khaneja et al. (2004), Broadband Relaxation-optimized Polarization Transfer in Magnetic Resonance, PNAS, vol. 101, pp. 14742-14747.
Kobzar et al. (2005), Pattern Pulses: Design of Arbitrary Excitation Profiles as a Function of Pulse Amplitude and Offset, Journal of Magnetic Resonance, vol. 173, pp. 229-235.

(Continued)

*Primary Examiner* — Gregory H Curran

(57) ABSTRACT

The present disclosure provides for a method of designing a radiofrequency or broadband pulse sequence. The method can comprise a qubit (e.g., nuclear spin, photon, electron, atomic spin, dot spin) and a harmonic oscillator wherein a flip angle is controlled by steering a spring between specific states.

20 Claims, 6 Drawing Sheets

(56) References Cited

OTHER PUBLICATIONS

Li (2005), Ensemble control of finite-dimensional time-varying linear systems, IEEE Transactions on Automatic Control, vol. 56, No. 2, pp. 345-357.
Li et al. (2006), Control of Inhomogeneous Quantum Ensembles, Physical Review A, vol. 73, Article No. 030302.
Li et al. (2011), Optimal pulse design in quantum control: A unified computational method, PNAS, vol. 108, No. 5, pp. 1879-1884.
Petta et al. (2005), Coherent Manipulation of Coupled Electron Spins in Semiconductor Quantum Dots, Science, vol. 309, pp. 2180-2184.
Pryor et al. (2006), Fourier Decompositions and Pulse Sequence Design Algorithms for Nuclear Magnetic Resonance in Inhomogeneous Fields, Journal of Chemical Physics, vol. 125, Article No. 194111.
Santagiustina et al. (2013), All-optical Signal Processing using Dynamic Brillouin Gratings, Scientific Report, vol. 3, Article No. 1594.
Shinnar et al. (1989), The application of spinors to pulse synthesis and analysis, Magnetic Resonance in Medicine, vol. 12, pp. 93-98.
Silver et al. (1984), Selective population inversion in NMR, Nature, vol. 310, pp. 681-683.
Silver et al. (1985), Selective Spin Inversion in Nuclear Magnetic Resonance and Coherent Optics through an Exact Solution of the Bloch-Riccati Equation, Physical Review A, vol. 31, No. 4, pp. 2753-2755.
Slepian et al. (1961), Prolate spheroidal wave function, fourier analysis and uncertainly—I. The Bell System Technical Journal, vol. 40, pp. 4364.
Slepian et al. (1978), Prolate spheroidal wave function, fourier analysis and uncertainly—V: The Discrete Case. The Bell System Technical Journal, vol. 57, pp. 1371-1430.
Zlotnik et al. (2012), Synthesis of optimal ensemble controls for linear systems using the singular value decomposition, 2012 American Control conference, Montreal, Jun. 2012.

\* cited by examiner

METHODS OF CONSTRUCTING AND DESIGNING RF PULSES AND EXCITING OR INVERTING TWO-LEVEL SYSTEMS

CROSS-REFERENCE TO RELATED APPLICATIONS

This application claims priority from U.S. Provisional Application Ser. No. 62/519,859 filed on 14 Jun. 2017, which is incorporated herein by reference in its entirety.

STATEMENT REGARDING FEDERALLY SPONSORED RESEARCH OR DEVELOPMENT

This invention was made with government support under grant number CMMI1462796 awarded by National Science Foundation. The government has certain rights in the invention.

MATERIAL INCORPORATED-BY-REFERENCE

Not applicable.

FIELD OF THE INVENTION

The present disclosure generally relates to methods of generating pulse sequences.

SUMMARY OF THE INVENTION

Among the various aspects of the present disclosure is the provision of a designing a broadband radiofrequency pulse sequence.

An aspect the present disclosure provides for a method of performing broadband excitation or inversion of a two-level spin system.

In some embodiments, the method can include providing a two-level system comprising at least one qubit (spin) and at least one harmonic oscillator (spring); defining a radio frequency (RF) bandwidth for the two-level system; bounding a radio frequency (RF) amplitude or total energy for an RF pulse; determining a desired terminal magnetization profile or flip angle for the spins; determining a desired terminal magnetization profile or flip angle for the springs; mapping the springs to spins comprising mapping an endpoint of a trajectory of the spins to an endpoint of a trajectory of the springs, wherein the endpoints of the spins and springs correspond to the desired terminal magnetization profile or flip angle; employing a single control or two controls simultaneously in both an x direction and a y direction; calculating a converging solution for an RF pulse; or steering the spring and the spin to a desired terminal magnetization profile or flip angle by applying the calculated converging solution for the RF pulse to the two-level system.

In some embodiments, the calculating a converging solution comprises generating RF pulse parameters, providing a first control design comprising a minimum-energy broadband pulse, or providing a second control design comprising an amplitude-limited broadband pulse.

In some embodiments, the two-level spin system is selected from the group consisting of a logical qubit spin system, a nuclear spin system, a photon spin system, an electron spin system, an atomic spin system, and a dot spin system.

In some embodiments, a dynamic connection between nonlinear spin and linear spring systems are calculated under optimal forcing to design an RF pulse based on the design of a control to steer linear harmonic oscillators In some embodiments, a condition of a one-to-one correspondence to a spin trajectory is satisfied.

In some embodiments, the RF pulse conditions result in the spins and springs having coinciding magnetization on the same axis and excitation or inversion of at least 99% of the spins and springs.

In some embodiments, the RF pulse compensates for a distribution of spin and spring frequencies.

In some embodiments, the RF pulse is an excitation pulse, a reverse excitation pulse; or an inversion pulse.

In some embodiments, the RF pulse results in a spin flip angle selected from $\pi$, $\pi/2$, or $\pi/4$.

In some embodiments, the RF pulse is computed using linear systems to force or steer the spring.

In some embodiments, the RF pulse is an excitation pulse or an inversion pulse for a nonlinear Bloch system.

Another aspect of the present disclosure provides for a method of constructing an RF pulse.

In some embodiments, the method includes obtaining an energy parameter obtaining a bandwidth parameter obtaining a desired flip angle (magnetization profile), wherein the flip angle is between 0 and 180 degrees; converting the desired flip angle from a spatial coordinate system to a linear coordinate system; inputting the energy parameter, the bandwidth parameter, and the linear coordinates into the system; or analytically deriving parameters for the RF pulse. In some embodiments, the RF pulse produces a desired magnetization profile of a final spin or spring state.

In some embodiments, the bandwidth parameter corresponds to a range of frequencies of a sample; the method can be performed on-line; or the method uses analytical approaches or optimization-free algorithms.

In some embodiments, the method includes providing a two-level system comprising at least one qubit (spin) and at least one harmonic oscillator (spring) and mapping the spins to the springs; or providing a maximum allowable amplitude a bound on an RF pulse amplitude for use in a broadband RF pulse.

In some embodiments, the method includes providing a first control design comprising a minimum-energy broadband pulse; or providing a second control design comprising an amplitude-limited broadband pulse In some embodiments, the RF pulse produces a desired distribution of final spin or spring states or a desired magnetization profile when applied to a two-level spin system; achieves at least 99% broadband excitation or inversion; or is not a hyperbolic secant pulse.

In some embodiments, the RF pulse compensates for a distribution of spin and spring frequencies; or satisfies experimental requirements selected from a bound on the RF pulse amplitude or total energy of the RF pulse.

In some embodiments, the bandwidth parameter is between −40 kHz and 40 kHz.

In some embodiments, the energy parameter comprises a maximum allowable power in Watts or dbm.

In some embodiments, flip angle is between 0 and 360° or selected from a $\pi$, a $\pi/2$, or a $\pi/4$ flip angle.

Yet another aspect of the present disclosure provides for a method of designing a broadband radiofrequency (RF) pulse sequence.

In some embodiments the method includes providing a two-level spin system comprising at least one qubit (spin) and at least one harmonic oscillator (spring); employing at least a first control design and optionally, a second control design simultaneously in both an x and a y direction; or achieving a desired flip angle of a qubit. In some embodiments, the flip angle of a qubit is controlled by steering the spring between specific states.

In some embodiments, the qubit is selected from the group consisting of a logical qubit, a nuclear spin, a photon, an electron, an atomic spin, and a dot spin. In some embodiments, the qubit is a nuclear spin and a broadband RF pulse compensates for a distribution of spin and spring frequencies.

In some embodiments, the method includes numerical optimization, resulting in an RF pulse or an RF pulse sequence that places bounds on a radio-frequency (RF) amplitude or a total energy of the RF pulse.

In some embodiments, the control comprises the first control design comprises a minimum-energy broadband pulse; and the second control design comprises an amplitude-limited broadband pulse; the flip angle can be between about 0° and 360°; or the RF pulse performs at least 99%, exact, or asymptotically exact excitation or inversion over a defined bandwidth, optionally with a bounded amplitude.

In some embodiments, the RF pulse has a bang-bang pulse shape.

In some embodiments, an excitation or inversion of the spins can be adjusted by selecting different amplitude bounds and RF pulse durations.

Other objects and features will be in part apparent and in part pointed out hereinafter.

DESCRIPTION OF THE DRAWINGS

Those of skill in the art will understand that the drawings, described below, are for illustrative purposes only. The drawings are not intended to limit the scope of the present teachings in any way.

to $\theta=0$, $\phi=0$, i.e., $M(T)=(0, 0, 1)'$, for $\omega=3$ and $T=\pi$. These controls are designed separately as described in (54) and (55) to drive the spring from $$\tilde{m}(0) = \frac{\pi}{8} + i\frac{\pi\sqrt{3}}{8}$$

to $\tilde{m}(T)=0$. We show the control pulse, the corresponding spin $(m(t), z(t))$ and spring $X(t)$ trajectories, the evolutions of the complex-valued functions $f(t)$, $g(t)$, and $a(t)$ following $\alpha(t)$, and the trajectories visualized on the sphere. Notice that the values of $f(0)$ and $g(0)$ are set to accommodate the different initial starting state. The control achieves a transfer with performance $z(t)=0.99998$. This example, and others like it, empirically demonstrates that the framework presented here is able to generalize to both the setting of arbitrary rotation angles as well as the design of two controls to execute these rotations in arbitrary directions.

Figure 9:
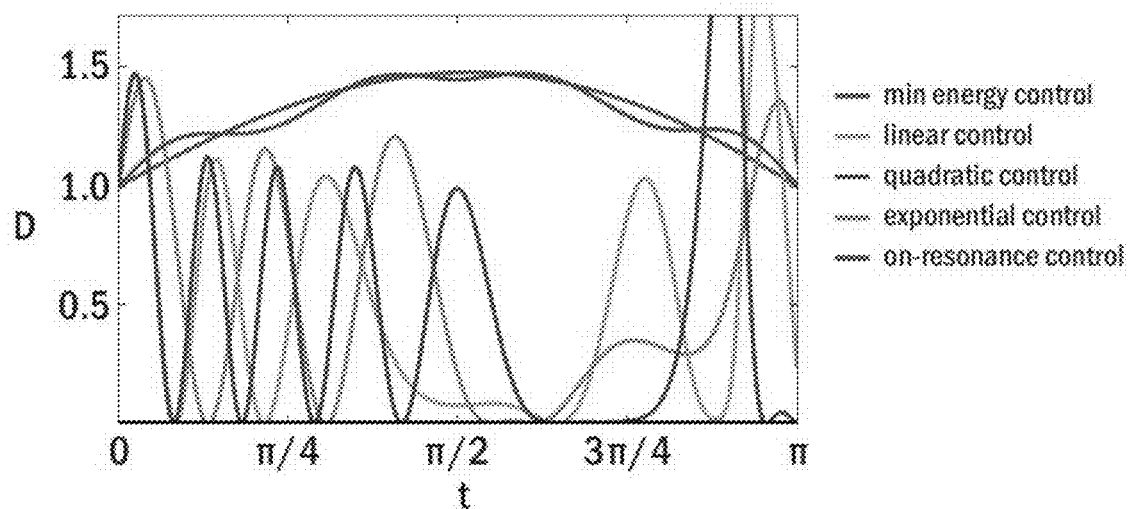

FIG. 9. The trajectory of the discriminant of D as given by (59) resulting from the minimum-energy control; a linear control, $u(t)=9/4\ t-9/8\ \pi^2$; a quadratic control $u(t)=9/4\ t^2-9/8\ \pi^2+1/2$; and an exponential control $$u(t) = \frac{5\pi}{1+e^{\pi}}e^t - \frac{9}{4}$$

that steer the spring from $(\pi/2, 0)'$ to $(0, 0)'$.

The performance (the z magnetization at $T=\pi$) following each control is 0.9991, $-0.7647$, 0.2127, $-0.4205$, 0.9525, respectively (the performance of the exponential control, 0.9525, is a coincidence at these parameter values). Recall (see Section 2.4 of Example 2) that the performance of the minimum energy pulse can be made arbitrarily close to 1 (e.g., increasing the duration to $T=10\pi$ yields a performance $z(T)=0.999991$). The well-known on-resonance pulse, $\alpha(t)=-\frac{1}{2}e^{i3t}$, which uses two controls ($u(t)=-\frac{1}{2}\cos 3t$, $v(t)=-\frac{1}{2}\sin 3t$) to perform exact excitation of a single spin (but is not extendable to the broadband case) is also shown as a comparison and also satisfies the discriminant condition in (59).

Figure 10:
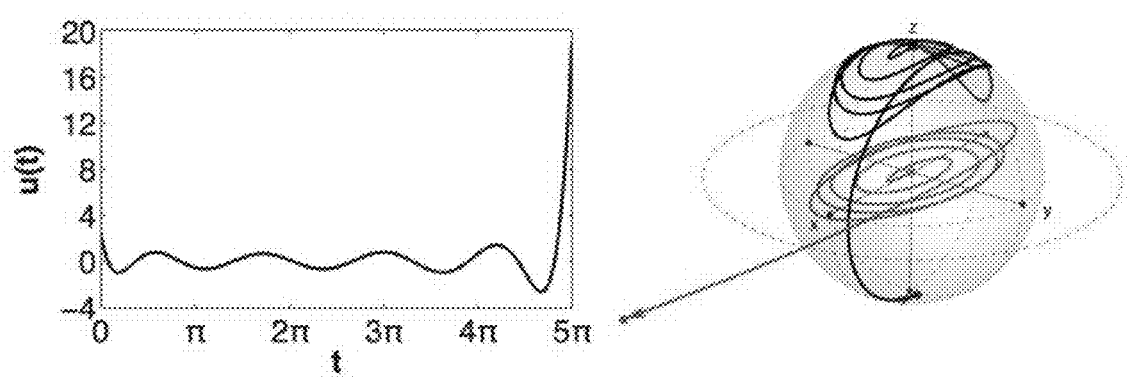

FIG. 10. The broadband minimum-energy control steers a family of harmonic oscillators with frequencies $-1 \le \omega \le 1$ from $(0, 0)'$ to $(\pi, 0)'$, with the corresponding trajectories of the harmonic oscillator (red) and nuclear spin (black) for $\omega=-1$. This pulse achieves an average magnetization inversion, over the frequencies $-1 \leq \omega \leq 1$ of $-0.9984$.

DETAILED DESCRIPTION OF THE INVENTION

The present disclosure is based, at least in part, on the discovery that a nontrivial dynamic connection between nonlinear spin and linear spring systems under optimal forcing. As disclosed herein, it was shown that a properly conditioned forcing of the linear harmonic oscillator, which can be computed using known linear systems theory, is an excitation pulse for the nonlinear Bloch system. Disclosed herein is the surprising result that such nonlinear and complex pulse design problems are equivalent to designing controls to steer linear harmonic oscillators, under certain conditions. We derive analytic broadband $\pi/2$ and $\pi$ pulses that perform exact, or asymptotically exact, excitation and inversion over a defined bandwidth, and also with bounded amplitude. As shown herein, the present disclosure provides for a framework that provides a methodology to design analytic broadband pulses for controlling quantum systems. The present disclosure also provides for analytical quantum pulses that can be computed with minimal numerical computational efforts, and will have significant impact on the areas of nuclear magnetic resonance (NMR) spectroscopy and magnetic resonance imaging (MRI), quantum computation, and quantum information processing, because these applications are enabled by a single or a sequence of pulses. As such, the presently disclosed analytical pulse design protocols can be used on MRI scanners and NMR spectrometers to obtain high-resolution medical images and protein spectroscopy. The present disclosure is also described in Li et al. Nature Comm. 8:446.

The present disclosure reveals a dynamic connection between the evolution of nuclear spins and harmonic oscillators (springs) driven by the same external control input. In particular, we are able to create 90° and 180° pulses used commonly in nuclear magnetic resonance (NMR) by designing controls that steer a spring between specific states. The linearity of the spring dynamic enables us to obtain simple analytic expressions for these NMR pulses. We extend this insight to spin and spring ensembles in order to design broadband NMR pulses that compensate for a distribution of spin (and spring) frequencies. Using this technique in conjunction with efficient numerical optimization we can design pulse sequences that also satisfy specific experimental requirements, such as a bound on the radio-frequency (RF) amplitude or the total energy of the pulse. Frequency can be in $s^{-1}$ (Hz), radians, etc.

As described herein, the RF pulse can also be a sequence of RF pulses to provide a desired spin flip angle.

Designing accurate and high-fidelity broadband pulses is an essential component in conducting quantum experiments across fields from protein spectroscopy to quantum optics. However, constructing exact and analytic broadband pulses remains unsolved due to the nonlinearity and complexity of the underlying spin system dynamics. We reveal a nontrivial dynamic connection between nonlinear spin and linear spring systems under optimal forcing and present the surprising result that such nonlinear and complex pulse design problems are equivalent to designing controls to steer linear harmonic oscillators, under certain conditions. We derive analytic broadband $\pi/2$ and $\pi$ pulses that perform exact, or asymptotically exact, excitation and inversion over a defined bandwidth, and also with bounded amplitude.

The presently disclosed methods provide for an advancement over the state of the art. For example, current methods for pulse optimization are based on numerical optimization with software using large scale, non-linear approaches. Such approaches may or may not converge and are time intensive. Such approaches cannot be currently performed on-line. The methods described herein converge and can be performed on-line.

The methods of the present disclosure provide other advantages over current methods. For example, as described herein are methods of designing an RF pulse with precise fidelity (100% or asymptotically close to 100%) for an entire bandwidth of qubits (e.g., nuclear spins) given experimental parameters (e.g., power constraints and desired bandwidth). The RF pulse is designed by converting a non-linear design problem into a linear design problem. Advantages of the disclosed methods include (i) the application can be performed in situ, on-line, in real-time, with no need for re-computing; (ii) the solution always converges (because the non-linear problem is converted into a linear problem); (iii) the designed pulse excites the entire spin system, allowing for an increased spin magnetization/alignment (e.g., especially for "off-resonance" spins), resulting in increased SNR, increased phase coherence, and improved resolution; and (iv) can use lower or same energy and obtain same or better results, respectively.

Applications for the disclosed methods include, but are not limited to, controlling spin systems, including NMR (e.g., protein NMR), MRI, EPR, ESR, SNR, ultra-fast optical devices, quantum computing, quantum gating, and quantum information processing.

Spin is a form of angular momentum carried by elementary particles. It was discovered that the solution can be solved analytically because spin systems are nonlinear and difficult to work with, while spring systems, or harmonic oscillators, are linear and easier to work with.

Spin dynamics, pulse sequences and other NMR pulse sequence design processes are well known; see e.g., Spin Dynamics: Basics of Nuclear Magnetic Resonance, Edition 2 Malcolm H. Levitt May 20, 2013 John Wiley & Sons; Understanding NMR Spectroscopy: Edition 2 James Keeler Sep. 19, 2011 John Wiley & Sons. Except as otherwise noted herein, therefore, the process of the present disclosure can be carried out in accordance with such processes.

Definitions and methods described herein are provided to better define the present disclosure and to guide those of ordinary skill in the art in the practice of the present disclosure. Unless otherwise noted, terms are to be understood according to conventional usage by those of ordinary skill in the relevant art.

In some embodiments, numbers expressing quantities of ingredients, properties such as molecular weight, reaction conditions, and so forth, used to describe and claim certain embodiments of the present disclosure are to be understood as being modified in some instances by the term "about." In some embodiments, the term "about" is used to indicate that a value includes the standard deviation of the mean for the device or method being employed to determine the value. In some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the present disclosure are approximations, the numerical values set forth in the specific examples are reported as precisely as practicable. The numerical values presented in some embodiments of the present disclosure may contain certain errors necessarily resulting from the standard deviation found in their respective testing measurements. The recitation of ranges of values herein is merely intended to serve as a shorthand method of referring individually to each separate value falling within the range. Unless otherwise indicated herein, each individual value is incorporated into the specification as if it were individually recited herein.

In some embodiments, the terms "a" and "an" and "the" and similar references used in the context of describing a particular embodiment (especially in the context of certain of the following claims) can be construed to cover both the singular and the plural, unless specifically noted otherwise. In some embodiments, the term "or" as used herein, including the claims, is used to mean "and/or" unless explicitly indicated to refer to alternatives only or the alternatives are mutually exclusive.

The terms "comprise," "have" and "include" are open-ended linking verbs. Any forms or tenses of one or more of these verbs, such as "comprises," "comprising," "has," "having," "includes" and "including," are also open-ended. For example, any method that "comprises," "has" or "includes" one or more steps is not limited to possessing only those one or more steps and can also cover other unlisted steps. Similarly, any composition or device that "comprises," "has" or "includes" one or more features is not limited to possessing only those one or more features and can cover other unlisted features.

All methods described herein can be performed in any suitable order unless otherwise indicated herein or otherwise clearly contradicted by context. The use of any and all examples, or exemplary language (e.g. "such as") provided with respect to certain embodiments herein is intended merely to better illuminate the present disclosure and does not pose a limitation on the scope of the present disclosure otherwise claimed. No language in the specification should be construed as indicating any non-claimed element essential to the practice of the present disclosure.

Groupings of alternative elements or embodiments of the present disclosure disclosed herein are not to be construed as limitations. Each group member can be referred to and claimed individually or in any combination with other members of the group or other elements found herein. One or more members of a group can be included in, or deleted from, a group for reasons of convenience or patentability. When any such inclusion or deletion occurs, the specification is herein deemed to contain the group as modified thus fulfilling the written description of all Markush groups used in the appended claims.

All publications, patents, patent applications, and other references cited in this application are incorporated herein by reference in their entirety for all purposes to the same extent as if each individual publication, patent, patent application or other reference was specifically and individually indicated to be incorporated by reference in its entirety for all purposes. Citation of a reference herein shall not be construed as an admission that such is prior art to the present disclosure.

Having described the present disclosure in detail, it will be apparent that modifications, variations, and equivalent embodiments are possible without departing the scope of the present disclosure defined in the appended claims. Further-more, it should be appreciated that all examples in the present disclosure are provided as non-limiting examples.

EXAMPLES

The following non-limiting examples are provided to further illustrate the present disclosure. It should be appreciated by those of skill in the art that the techniques disclosed in the examples that follow represent approaches the inventors have found function well in the practice of the present disclosure, and thus can be considered to constitute examples of modes for its practice. However, those of skill in the art should, in light of the present disclosure, appreciate that many changes can be made in the specific embodiments that are disclosed and still obtain a like or similar result without departing from the spirit and scope of the present disclosure.

Example 1: Exact Broadband Excitation of Two-Level Systems—Mapping Spins to Springs This example describes the derivation of analytic broadband pulses (e.g., $\pi/2$ and $\pi$ pulses) that perform exact, or asymptotically exact, excitation and inversion over a defined bandwidth, and also with bounded amplitude.

Manipulating large ensembles of dynamical systems by a single control signal is a common challenging problem in experimental physics, chemistry, biology, and neuroscience; difficult chiefly due to the inherent heterogeneity present in the systems. For example, in spectroscopic applications such as nuclear magnetic resonance (NMR) spectroscopy, optical spectroscopy, magnetic resonance imaging (MRI), and quantum computing, experiments are often performed on quantum ensembles on the order of $10^{23}$ rather than individual molecules or atoms (1, 2, 3, 4, 5, 6, 7). These experiments are conducted through a sequence of engineered electromagnetic pulses that produce a desired excitation profile or a time evolution of the quantum ensemble. NMR spectroscopy offers canonical examples, including broadband excitation and inversion of spin populations, where a single coil is available to generate radio-frequency (RF) fields that are used to steer all nuclear spins of a particular type (e.g., protons) in a macroscopic sample from some initial state (e.g., thermal equilibrium) to a desired target state (e.g., transverse magnetization with a desired phase). The ability to perform a state-to-state transformation of this type has direct impact on experimental outcomes in, for example, increasing medical image resolution (8), amplifying off-resonance signal recovery in large-protein NMR (9), achieving effective coherent control of logical qubits (10), and developing pulses for ultrafast all-optical signal processing devices (11).

The Bloch model is a semi-classical description that describes the evolution of a two-level system and is of the form, $$\frac{d}{dt}\begin{bmatrix} M_x(t,\omega) \\ M_y(t,\omega) \\ M_z(t,\omega) \end{bmatrix} = \begin{bmatrix} 0 & -\omega & u(t) \\ \omega & 0 & -v(t) \\ -u(t) & v(t) & 0 \end{bmatrix} \begin{bmatrix} M_x(t,\omega) \\ M_y(t,\omega) \\ M_z(t,\omega) \end{bmatrix}, \quad (1)$$

when the duration of the external RF pulse, T, is much shorter than the transverse and longitudinal relaxation times $T_2$ and $T_1$ (1). In this case, the effects of relaxation can be neglected and the bulk "spin" magnetization vector $M=(M_x, M_y, M_z)$ evolves on a sphere. In the absence of an irradiating RF pulse for a time that is much longer than $T_1$, the spin vector aligns with the static magnetic field, conventionally in the +z direction (the spin magnitude is typically normalized so we consider a unit sphere). To simplify the presentation of the analysis, we consider a pulse applied only along the y-axis, i.e., $u(t)=-\gamma B_{1y}$ and $v(t)=-\gamma B_{1x}=0$, where $B_1$ is the strength of the applied RF pulse and $\gamma$ is the gyromagnetic ratio (we discuss an implementation with both controls in Section 2.5 of Example 2).

If the spin population is characterized by a single frequency, it is well known that an on-resonance sinusoidal pulse, where the frequency of the RF pulse is tuned to match the frequency of the sample, is able to excite or invert the spins exactly. In these cases, equalization (a $\pi/2$ or 90° rotation) or inversion (a $\pi$ or 180° rotation) of the spin population can be achieved in $T=\pi/(2\gamma B_1)$ or $T=\pi/(\gamma B_1)$ units of time, respectively (12). For the sake of simplicity, the rest of the manuscript uses dimensionless variables, normalized by the value of $\gamma B_1$.

In practice, however, the resonance frequencies of the spins are spread over a range due to chemical shifts caused by varying levels of magnetic shielding (1) or by magnetic field gradients (8). Practitioners regularly use this frequency dispersion in constructive ways in order to distinguish between nuclei in different chemical environments, however, the same phenomenon makes manipulating spin populations uniformly over a specified bandwidth highly nontrivial.

Calculating the time evolution of the spin magnetization corresponding to a given RF pulse can be accomplished through straightforward integration, however, solving the "inverse" pulse design problem, which seeks to construct an RF pulse that produces a desired distribution of final spin states M(T), or magnetization profile, is much more difficult. Work to date has focused on developing robust numerical optimization techniques to search for an optimal pulse that achieves broadband excitation or inversion. These methods are often highly customized and have slow or unverified convergence rates, especially when designing pulse sequences for difficult experiments with more demanding performance specifications (13). The development of analytical approaches or optimization-free algorithms for broadband pulse design has been minimal due to the nonlinearity of the spin dynamics. The exceptions are the hyperbolic secant pulse (14), which is a parameter-dependent selective inversion pulse, where the selectivity is achieved when the amplitude of the pulse reaches above a threshold and when the pulse parameters are appropriately tuned, and the Shinnar-Le Roux algorithm, which maps the problem of selective pulse design to the design of finite impulse response (FIR) filters (15). In this work, we present an analytic result for broadband pulse design.

Results

Mapping Spins to Springs.

Consider separately the dynamics of an undamped harmonic oscillator represented in matrix form, $$\frac{d}{dt}\begin{bmatrix} x(t,\omega) \\ y(t,\omega) \end{bmatrix} = \begin{bmatrix} 0 & -\omega \\ \omega & 0 \end{bmatrix}\begin{bmatrix} x(t,\omega) \\ y(t,\omega) \end{bmatrix} + \begin{bmatrix} 1 \\ 0 \end{bmatrix} u(t), \qquad (2)$$

where the state $X=(x,y)$, $\omega$, and $u(t)$ represent the oscillator's velocity and position, frequency, and external forcing, respectively (see Section 1 in Example 2). Observe that the unforced dynamics, $u(t)=v(t)=0$ in equation (1), of the transverse components ($M_x$ and $M_y$) of the spin magnetization coincide with the dynamics of an unforced, $u(t)=0$, undamped harmonic oscillator, or "spring", of the same frequency. It is intriguing then to explore the possibility that the connection between the spin and the spring can be preserved even when driven by a common external input. In this report, we identify and characterize the unexpected dynamic connection between the time-evolution of forced spins and springs that is not limited to the linear regime of small rotation angles. We exploit this connection to offer an analytic solution to the broadband pulse design problem. Ultimately, there can be no direct mapping for every point along the evolution of these linear and nonlinear systems; however, we discover a dynamic projection that maps the endpoints of the trajectory of a spin to that of a spring, which is sufficient, because the pulse design problem is defined by the desired terminal magnetization profile.

To develop this connection, we construct the complex projection, $$f(t) = \frac{M_x(t) + iM_y(t)}{a(t) + M_z(t)}, \qquad (3)$$

where $0 \le t \le T$ is the pulse duration and $a(t)=a_1(t)+ia_2(t)$ is a complex-valued function satisfying a Riccati equation with the initial condition $a(0)=1$ and depending on the time-varying RF pulse (see equation (13) in Section 2.1 of Example 2). If $a(t)=1$ over the entire duration, then $f(t)$ simply becomes the stereographical projection. Using the fact that the magnitude of the vector $\|M\|=1$, we can compose conditions on $f(t)$ and $a(t)$ to ensure that the dynamic projection yields a valid (i.e., noncomplex-valued and unique) Bloch trajectory (see Section 3 of Example 2). The necessary and sufficient condition for the projection in equation (3) to be a one-to-one correspondence to a spin trajectory is in terms of the following bound on $f(t)$, $$0 \le |f|^2 < \frac{1 - |a|^2 + \sqrt{(1-|a|^2)^2 + 4a_2^2}}{2a_2^2}, \qquad (4)$$

where $|a|^2 = a_1^2 + a_2^2$. This condition also indicates why the stereographic projection fails to provide a mapping in the general case (see Section 3 of Example 2).

Using this dynamic projection, we show that an RF pulse, $u(t)$, which results in $f(t)$ that satisfies equation (4) and the following integral condition, $$\int_0^T u(t)e^{i\omega t}dt = -\frac{\pi}{2}, \qquad (5)$$

steers the Bloch system from $M(0)=(1, 0, 0)$ to $M(T)=(0, 0, 1)$–a reverse excitation pulse (see Section 2.1 of Example 2). Classic linear systems analysis (16) reveals that the external forcing that steers a harmonic oscillator of the same frequency from $X(0)=(\pi/2, 0)$ to $X(T)=(0, 0)$ must satisfy the same integral condition in equation (5), therefore, under the bound in equation (4), the conditions on the controls for driving the spin and spring coincide. More precisely, we show that $u(t)$ satisfying equation (4) will exactly transfer the value of the dynamic projection $f(t)$ from 1 to 0, and hence drives a reverse excitation of the spin in the Bloch system, in the absence of irregular singularities caused by the evolution of a(t) at time T (see Sections 2.2-2.4 of Example 2). The input that steers the spring from $X_0=(0, 0)$ to $X_{\pi/2}=(\pi/2, 0)$ at time T can be converted to a forward excitation pulse taking the spin from $M_0=(0, 0, 1)$ to $M_{\pi/2}=(1, 0, 0)$ by reversing it in time and changing its sign (17).

Analytical Optimal Excitation Pulses.

Figure 1:
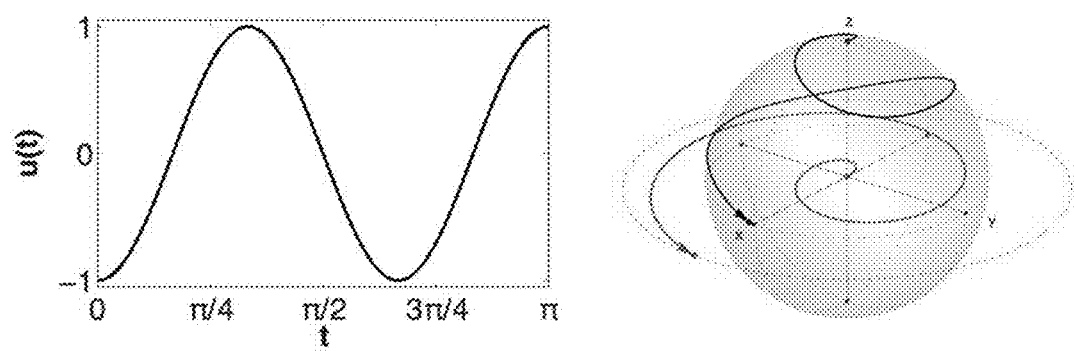
FIG. 1. The minimum-energy control $u^*_{\pi/2}$ steering the spring from $X_0=(0, 0)$ to $X_{\pi/2}=(\pi/2, 0)$, with the corresponding trajectories of the spring (red) and spin (black) for $\omega=3$ and $T=\pi$.

Most importantly—and the fundamental result reported in this work—a properly conditioned forcing of the linear harmonic oscillator, which can be computed using known linear systems theory, is an excitation pulse for the nonlinear Bloch system. Among the many potential control functions u(t) that complete the desired transfer, we can select the minimum-energy control, i.e., the control u*(t) that minimizes the cost functional $\int_0^T u^2(t)dt$ (see Section 1 of Example 2). For example, the minimum-energy control that steers the spring with frequency $\omega=3$ from $X_0$ to $X_{\pi/2}$ at $T=\pi$ is given by $u^*_{\pi/2}(t)=-\cos(3t)$, which is a $\pi/2$ pulse taking the spin from $M_0$ to $M_{\pi/2}$. This optimal control and the resulting trajectories of the spring and the spin with $\omega=3$ are illustrated in FIG. 1.

Figure 5:
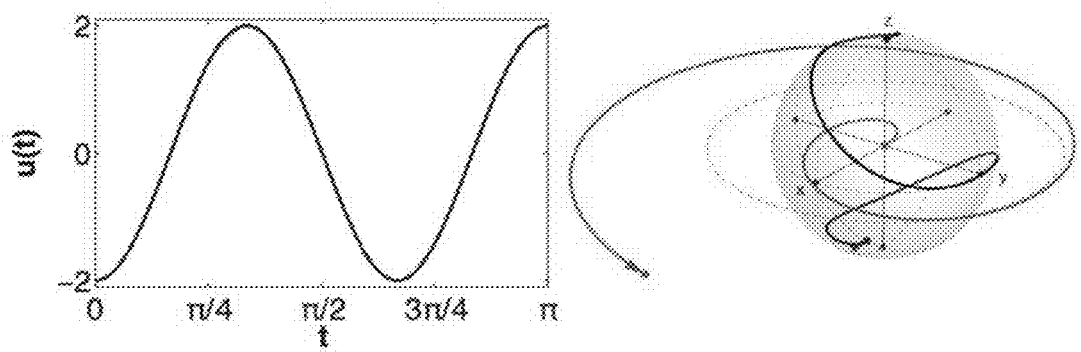
FIG. 5. The minimum-energy control steering the spring from $(0, 0)'$ to $(\pi, 0)'$, with the corresponding trajectories of the spring (red) and spin (black) for $\omega=3$ and $T=\pi$, where the final z magnetization of the spin is $-0.9851$. The final z magnetization can be made arbitrarily close to $-1$ by selecting the product $\omega T$ appropriately (see Section 2.4 of Example 2); for parameters $\omega=3$ and $T=10\pi$, $z(T)=-0.9999$.

The same notion can be adopted to design an inversion pulse, which is realized by constructing a control that steers the spring from $X_0$ to $X(T)=(\pi,0)=X_\pi$, or by concatenating a $\pi/2$ pulse with its time-reversed version (17), which is a pulse sequence $X_0$ to $X_{\pi/2}$ to $X_\pi$. The minimum-energy inversion pulse and the resulting trajectories for the spring and the spin of $\omega=3$ and $T=\pi$ are illustrated in FIG. 5 in Section 2.1 of Example 2.

Broadband Excitation Pulses.

Figure 2:
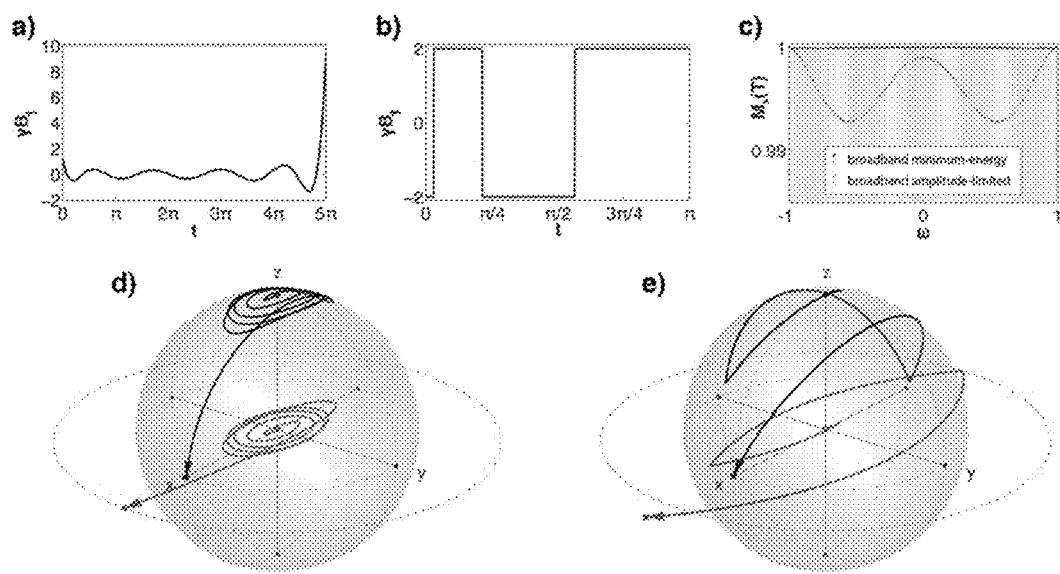
FIG. 2. The (a) broadband minimum-energy and (b) amplitude-limited controls steering a family of harmonic oscillators with frequencies $-1 \le \omega \le 1$ from $X_0=(0, 0)$ to $X_{\pi/2}=(\pi/2, 0)$, with the corresponding trajectories, (d) and (e), respectively, of the harmonic oscillator (red) and nuclear spin (black) for $\omega=-1$. (c) These pulses achieve average magnetization excitation, $M_x(T)$, over the frequencies $-1 \le \omega \le 1$, of 1.000 and 0.996, respectively.

The dynamic connection between spin and spring has enabled the analytic design of $\pi/2$ and $\pi$ pulses that manipulate the spin magnetization at a single frequency $\omega$. We now apply this discovery to design a control u(t) that simultaneously steers an ensemble of springs between $X_0$ and $X_{\pi/2}$ (or $X_\pi$), which is called a broadband $\pi/2$ (or $\pi$) pulse, respectively. The minimum-energy broadband controls can be derived by solving the integral equation (5) in function space (since $\omega$ becomes a variable) and are composed of the prolate spheroidal wave functions (see Section 4.1 of Example 2). FIG. 2 and FIG. 10 show broadband $\pi/2$ and $\pi$ pulses, respectively, which produce uniform excitation over the designed bandwidth. In practice these pulses can be constructed using the discrete prolate spheroidal sequences available in many scientific programming tools, such as "dpss" in Matlab (see Section 4.2).

Practical considerations, e.g., limited power of RF coils, make it critical to design pulses with bounded amplitude. Steering an ensemble of springs with a bounded control is a challenging optimal control problem. However, we show that it can be reduced to a convex optimization problem, which can be effectively solved, and the optimal control has a bang-bang pulse shape (see Section 4.2.1 of Example 2). The bang-bang pulse in FIG. 2 is an example of a bounded amplitude broadband $\pi/2$ pulse. The performance (i.e., average excitation) can be adjusted by selecting different amplitude bounds and pulse durations.

DISCUSSION

The dynamic mapping in equation (3) reveals a nontrivial connection between nonlinear spin and linear spring systems under optimal forcing and enables the design of analytical broadband pulses. The bound on this dynamic projection f(t) in equation (4) is critical to ensure the feasibility of the designed pulses. To illustrate the importance of this bound, in FIG. 3 we plot the time evolution of |f(t)| for the minimum-energy control and a quadratic control, which satisfies the integral condition in equation (5), but not the bound in equation (4). FIG. 9 in Section 3 shows several other such counterexample controls. Note that all controls steer the spring from $X_0$ to $X_{\pi/2}$, but only when equation (4) is satisfied in the minimum-energy case, does the control also steer the spin from $M_0$ to $M_{\pi/2}$.

Figure 8:
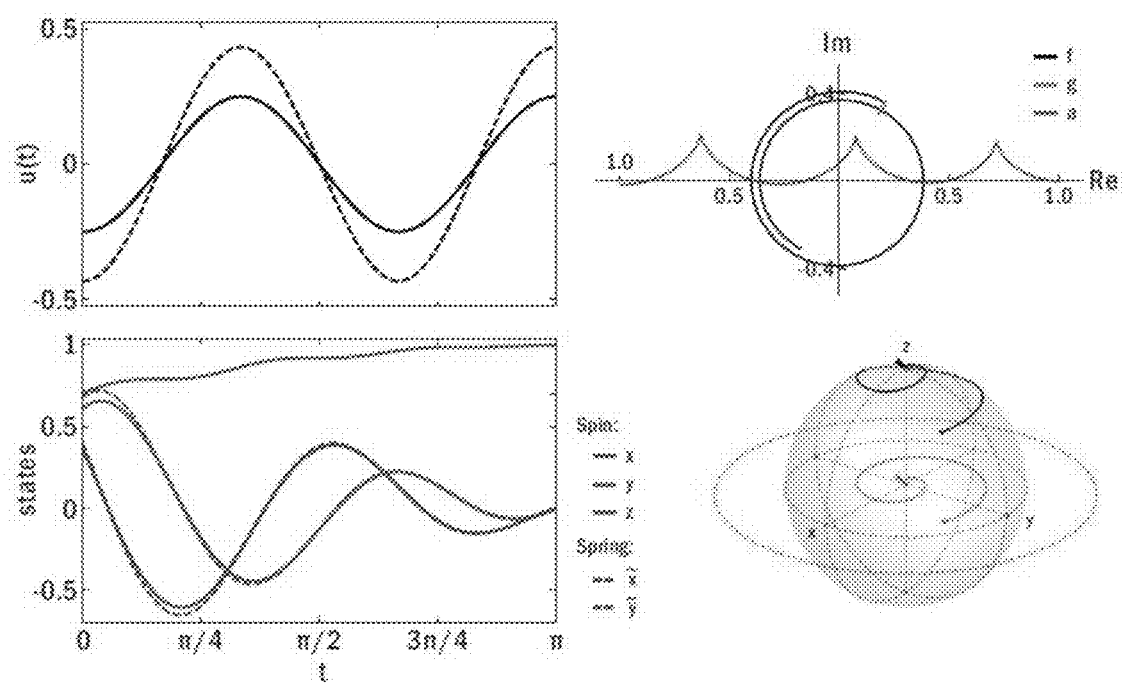
FIG. 8. The combined minimum energy controls $a(t)=u^*(t)+iv^*(t)=-\frac{1}{4}\cos(3t)-i\frac{1}{4}\cos(3t)-i\frac{1}{4}\cos(3t)$ executes a transfer of the spin from spherical coordinates $\theta=\pi/3$ (azimuthal angle), $\phi=\pi/4$ (polar angle), i.e., $$M(0) = \left(\frac{1}{2\sqrt{2}}, \frac{\sqrt{3}}{2\sqrt{2}}, \frac{1}{\sqrt{2}}\right)^r,$$

Moreover, empirical results presented in Section 2.6 and FIG. 8) strongly suggest that the framework described here can be generalized to design pulses that employ two controls simultaneously and also that achieve arbitrary flip angles (not only restricted to $\pi/2$ and $\pi$ pulses).

This work to derive conditions for analytic control inputs of spin systems as well as the extension to exact broadband excitation and inversion opens up new avenues for pulse sequence design in quantum control. The notion of dynamic projection methods on the spin-spring relationship introduced in the report, together with convex optimization formulation to solve the optimal control problem with an amplitude bound, lays a foundation to develop pulse sequences for more complicated profiles, such as frequency selective pulses.

Methods

Optimal Steering of Springs.

The minimum-energy control that steers the spring modeled in equation (2) from $X_0$ to $X_F$ can be derived using least squares theory (16) and is of the form $u^*(t)=B'e^{-A't}W^{-1}[e^{-AT}X_F-X_0]$, where W is the controllability Gramian of the spring system, defined by $W=\int_0^T e^{-At}BB'e^{-A't}dt$, where $$A = \begin{bmatrix} 0 & -\omega \\ \omega & 0 \end{bmatrix} \text{ and } B = \begin{bmatrix} 1 \\ 0 \end{bmatrix}.$$

For example, if the frequency of the spring is $\omega=3$, then the minimum-energy control that drives the spring from $X_0=(\pi/2,0)$ to $X_F=(0, 0)$ of during $\pi$ is $u^*(t)=-\cos(3t)$ for $t\in[0,\pi]$ (see Section 1).

Dynamic Mapping Between Spin and Spring.

Using the relation $M_x^2+M_y^2+M_z^2=1$ for all $t\in[0, T]$, the complex projection defined in equation (3) follows the dynamic equation $$\dot{f}=i\omega f+\tfrac{1}{2}uf^2+\tfrac{1}{2}\beta u, f(0)=1, \quad (6)$$

where $\beta=e^{2i\omega t}$, if the complex function $\alpha(t)$ is chosen to satisfy $$\dot{a} = -\frac{u\beta}{2m}a^2 - \frac{uz(\beta-1)}{m}a + \frac{u(1+z^2-z^2\beta)}{2m}, a(0) = 1.$$

Integrating (6) using contour integration, we show that f is steered to f(T)=0 following the control input that drives the spring from $X_0=(\pi/2,0)$ to $X_F=(0, 0)$. This implies that the spin is excited from $M_0=(0, 0, 1)$ to $M_{\pi/2}=(1, 0, 0)$, so that this control is a $\pi/2$ (or 90°) pulse (see Section 2).

REFERENCES

1. R. R. Ernst, G. Bodenhausen and A. Wokaun, Principles of Nuclear Magnetic Resonance in Once and Two Dimensions. Clarendon Press, Oxford (1987).
2. D. Cory, A. Fahmy and T. Havel, Ensemble Quantum Computing by NMR Spectroscopy, *PNAS*, 94, 1634-1639 (1997).

3. J.-S. Li and N. Khaneja, Control of Inhomogeneous Quantum Ensembles, *Physical Review A*, 73:030302 (2006).
4. S. J. Glaser, et. al., Unitary Control in Quantum Ensembles, Maximizing Signal Intensity in Coherent Spectroscopy, *Science*, 280, 421-424 (1998).
5. B. Pryor and N. Khaneja, Fourier Decompositions and Pulse Sequence Design Algorithms for Nuclear Magnetic Resonance in Inhomogeneous Fields, *Journal of Chemical Physics*, 125:194111 (2006).
6. M. S. Silver, R. I. Joseph, and D. I. Hoult, Selective Spin Inversion in Nuclear Magnetic Resonance and Coherent Optics through an Exact Solution of the Bloch-Riccati Equation, *Physical Review* A, 31(4), 2753-2755 (1985).
7. N. Khaneja, J.-S. Li, C. Kehlet, B. Luy, and S. J. Glaser, Broadband Relaxation-optimized Polarization Transfer in Magnetic Resonance, *Proceedings of the National Academy of Sciences*, 101, 14742-14747 (2004).
8. M. A. Bernstein, K. F. King, and X. J. Zhou, *Handbook of MRI Pulse Sequences* (Elsevier Academic Press, 2004).
9. D. P. Frueh, T. Ito, J.-S. Li, G. Wagner, S. J. Glaser and N. Khaneja, Sensitivity Enhancement in NMR of Macromolecules by Application of Optimal Control Theory, *Journal of Biomolecular NMR* 32, 23-30 (2005).
10. J. R. Petta, et al., Coherent Manipulation of Coupled Electron Spins in Semiconductor Quantum Dots. *Science*, 309, 2180 (2005).
11. M. Santagiustina, S. Chin, N. Primerov, L. Ursini, and L. Thavenaz, All-optical Signal Processing using Dynamic Brillouin Gratings, *Scientific Report*, 3, 1594 (2013).
12. J. Cavanagh, W. J. Fairbrother, A. G. Palmer, and N. J. Skelton, Protein NMR Spectroscopy, Academic Press, San Diego, Calif. (1996).
13. K. Kobzar, B. Luy, N. Khaneja, and S. J. Glaser, Pattern Pulses: Design of Arbitrary Excitation Profiles as a Function of Pulse Amplitude and Offset, *Journal of Magnetic Resonance*, 173, 229-235 (2005).
14. M. S. Silver, R. I. Joseph, C.-N. Chen, V. J. Sank, and D. I. Hoult, Selective population inversion in NMR, *Nature*, Vol. 310, 23 (1984).
15. M. Shinnar and J. Leigh, The application of spinors to pulse synthesis and analysis, *Magnetic Resonance Med.* 12, 93-98 (1989).
16. R. W. Brocket, *Finite Dimensional Linear Systems* (Wiley, 1970).
17. M. Braun and S. J. Glaser, Concurrently Optimized Cooperative Pulses in Robust Quantum Control: Application to Broadband Ramsey-Type Pulse Sequence Elements, *New Journal of Physics* 16, 115002 (2014).

Example 2: Supplemental Information

The major contribution of Example 1 was to reveal a dynamic connection between the evolution of nuclear spins and harmonic oscillators (springs) driven by the same external control input. In particular, we are able to create 90° and 180° pulses used commonly in nuclear magnetic resonance (NMR) by designing controls that steer a spring between specific states. The linearity of the spring dynamic enables us to obtain simple analytic expressions for these NMR pulses. We extend this insight to spin and spring ensembles in order to design broadband NMR pulses that compensate for a distribution of spin (and spring) frequencies. Using this technique in conjunction with efficient numerical optimization we can design pulse sequences that also satisfy specific experimental requirements, such as a bound on the radio-frequency (RF) amplitude or the total energy of the pulse.

Section 1: Optimal Steering of Springs

The well-known simple harmonic oscillator obeys a dynamic described by [|$]$¨$$[|$]$¨ A$\ddot{\tilde{y}}+\omega^2\tilde{y}=\tilde{u}$, with $\tilde{y}$ the position of the oscillator (or spring) and $\tilde{u}$ is a forcing term. If we let $$\tilde{x} = \frac{1}{\omega}\dot{\tilde{y}},$$

then $\dot{\tilde{y}}=\omega\tilde{x}$ and $$\dot{\tilde{x}} = \frac{1}{\omega}\ddot{\tilde{y}} = -\omega\tilde{y} + u, \text{ where } u = \frac{\tilde{u}}{\omega}.$$

Therefore, a forced, nondamped harmonic oscillator can be modeled as a linear dynamical system of the form, $$\frac{d}{dt}X(t) = AX(t) + Bu(t), \tag{1}$$

where $X=(\tilde{x}(t), \tilde{y}(t))'$ represents the state and ' denotes the transpose operation, $$A = \begin{bmatrix} 0 & -\omega \\ \omega & 0 \end{bmatrix}, \quad B = \begin{bmatrix} 1 \\ 0 \end{bmatrix}, \tag{2}$$

in which $\omega$ is the frequency of the harmonic oscillator, and u: [0, T]→R, T∈(0, ∞), is an external input (control), which is (piecewise) continuous on [0, T]. We consider steering this harmonic oscillator from the initial state $$X_0 = (\tilde{x}(0), \tilde{y}(0))' = \left(\frac{\pi}{2}, 0\right)'$$

to the origin, $X_F=(0, 0)'$, at a finite time T. Applying the variation of constants formula [1] to (1) yields $$X(T)=e^{AT}X_0+\int_0^T e^{A(T-\sigma)}Bu(\sigma)d\sigma.$$

Hence for $X(T)=X_F=(0, 0)'$, it requires that the control u(t) satisfies $$\int_0^T u(\sigma)\cos(\omega\sigma)d\sigma = -\frac{\pi}{2}, \tag{3}$$

$$\int_0^T u(\sigma)\sin(\omega\sigma)d\sigma = 0, \tag{4}$$

or equivalently $$\int_0^T u(t)e^{i\omega t}dt = -\frac{\pi}{2}, \tag{5}$$

in order to complete the desired transfer.

We know from linear systems theory [1] that the system (1) is controllable if $\omega\neq 0$, and therefore there exists at least one control u(t) that will accomplish the transfer from $X_0$ to $X_F$. It is also well-known that the minimum-energy control, u*(t), that achieves the desired transfer while minimizing the total energy, i.e., $\int_0^T u'(t)u(t)dt$, takes the form $$u^*(t) = B'e^{-At}W^{-1}\xi, \quad (6)$$

where $\xi = e^{-AT}X_F - X_0$ and W is the so-called controllability Gramian, given by $$W = \int_0^T e^{-At}BB'e^{-A't}dt = \begin{bmatrix} \frac{T}{2} + \frac{\sin(2\omega'T)}{4\omega} & -\frac{\sin^2(\omega T)}{2\omega} \\ -\frac{\sin^2(\omega T)}{2\omega} & \frac{T}{2} - \frac{\sin(2\omega T)}{4\omega} \end{bmatrix}.$$

For example, if the frequency of the spring is $\omega=3$, then the minimum-energy control of duration $\pi$ is $$u^*(t) = \frac{3\pi[\sin(3t) + \sin(6T-3t) - 6T\cos(3t)]}{\cos(6T + 18T^2 - 1)} = -\cos(3t), \quad (7)$$

for $t \in [0,\pi]$.

Section 2: Mapping Spins into Springs

The evolution of the bulk magnetization of a sample of nuclear spins immersed in an external magnetic field follows the Bloch equations [2], given by $$\frac{d}{dt}\begin{bmatrix} x(t) \\ y(t) \\ z(t) \end{bmatrix} = \begin{bmatrix} 0 & -\omega & u(t) \\ \omega & 0 & -v(t) \\ -u(t) & v(t) & 0 \end{bmatrix}\begin{bmatrix} x(t) \\ y(t) \\ z(t) \end{bmatrix}, \quad (8)$$

where $M(t) = (x(t), y(t), z(t))'$ is the magnetization vector and $u = -\gamma B_{1y}$ and $v = -\gamma B_{1x}$ are the applied RF fields in the y and x axis, respectively. As before, let $m(t) = x(t) + iy(t)$ be the complex transverse magnetization and $\bar{\alpha}(t) = u(t) - iv(t)$ (the complex conjugate of $\alpha$) be the irradiating RF field the Bloch equations may then be written in the complex form, that is, where $\bar{\alpha}$ denotes the complex conjugate of $\alpha$.

Section 2.1 Dynamic Mapping Between Spin and Spring

Defining f: [0, T]→C by $$f(t) = \frac{m(t)}{a(t) + z(t)}, \quad (11)$$

where a(t) is a complex-valued function over [0, T], then (9) and (10) can be transformed into the following Riccati equation, $$\dot{f} = i\omega f + \frac{1}{2}\alpha f^2 + \frac{1}{2}\bar{\alpha} + \frac{\bar{\alpha}(1-a^2) - 2m\dot{a}}{2(a+z)^2}, \quad (12)$$

in which we used $m\bar{m} + z^2 = 1$ since M(t) is conventionally a unit vector. Without loss of generality, we consider driving the Bloch equations as in (8) with one control letting $v = 0$ (in later sections we consider the case with two controls), and consider the canonical state transfer, equivalent to a 90° pulse, from the initial state $M(0) = (1, 0, 0)'$ in the transverse plane (i.e., $m(0)=1$ and $z(0)=0$) to a final state $M(T)=(0, 0, 1)'$ (i.e., $m(T)=0$ and $z(T)=1$).

Thus, we have $\alpha = \bar{\alpha} = u$, and (12) becomes $$\dot{f} = i\omega f + \frac{1}{2}uf^2 + \frac{1}{2}u + \frac{u(1-a^2) - 2m\dot{a}}{2(a+z)^2}.$$

If we choose the function a(t) such that $$\frac{u(1-a^2) - 2m\dot{a}}{2(a+z)^2} = \frac{e^{2i\omega t} - 1}{2}u,$$

with the initial condition $a(0)=1$, namely, a(t) satisfies the Riccati equation $$\dot{a} = -\frac{u\beta}{2m}a^2 - \frac{uz(\beta-1)}{m}a + \frac{u(1 + z^2 - z^2\beta)}{2m}, \quad a(0) = 1, \quad (13)$$

where $\beta = e^{2i\omega t}$, then f follows $$\dot{f} = i\omega f + \frac{1}{2}uf^2 + \frac{1}{2}\beta u, \quad (14)$$

with $f(0)=1$ since $m(0)=1$, $z(0)=0$, and $a(0)=1$. Now, let $g(t) = e^{-i\omega t}f(t)$, that is, f in the rotating frame with respect to $\omega$, then we obtain $$\dot{g} = \frac{1}{2}(g^2 + 1)ue^{i\omega t}. \quad (15)$$

By the separation of variables, we have $$\int_{g_0}^{g_1} \frac{2dg}{g^2 + 1} = \int_0^T ue^{i\omega t}dt, \quad (16)$$

where $g_0 = g(0) = 1$ and $g_1 = g(T)$. If the control function satisfies (5), then we have $$\int_{g_0}^{g_1} \frac{2dg}{g^2 + 1} = -\frac{\pi}{2},$$

which, by contour integration, leads to $g_1 = g(T) = 0$, and hence $f(T) = 0$. More specifically, the contour integration and the residue theorem [3] applied to (16) with the condition (5) gives $$\int_1^{c+id} \frac{2dg}{g^2+1} = 2\pi i w_1 \text{Res}\left(\frac{2}{g^2+1}, i\right) + 2\pi i w_2 \text{Res}\left(\frac{2}{g^2+1}, -i\right) -$$
$$\int_d^0 \frac{2idy}{(c+iy)^2+1} - \int_e^1 \frac{2dx}{x^2+1},$$
$$= 2\pi(w_1 - w_2) + \int_0^d \frac{2idy}{(c+iy)^2+1} + 2\tan^{-1}c - \frac{\pi}{2},$$
$$= 2\pi(w_1 - w_2) + 2\tan^{-1}(c+id) - \frac{\pi}{2} = -\frac{\pi}{2},$$

where $g_1 = c + id$, $c, d \in \mathbb{R}$, and $w_1$ and $w_2$ are the respective winding numbers of the poles i and −i. The above equation is reduced, by the logarithmic form of the arctangent function, to $$\frac{i}{2}\ln\left[\frac{c^2 + (1+d)^2}{c^2 + (1-d)^2}\right] + \tan^{-1}\left[\frac{2c}{1-c^2-d^2}\right] = 0, \quad (17)$$

Therefore, we have $$\tan^{-1}\left[\frac{2c}{1-c^2-d^2}\right]=0 \text{ and } \ln\left[\frac{c^2+(1+d)^2}{c^2+(1-d)^2}\right]=0,\quad (5)$$

which lead to c=0 and d=0 and give $g_1$=0.

Figure 4:
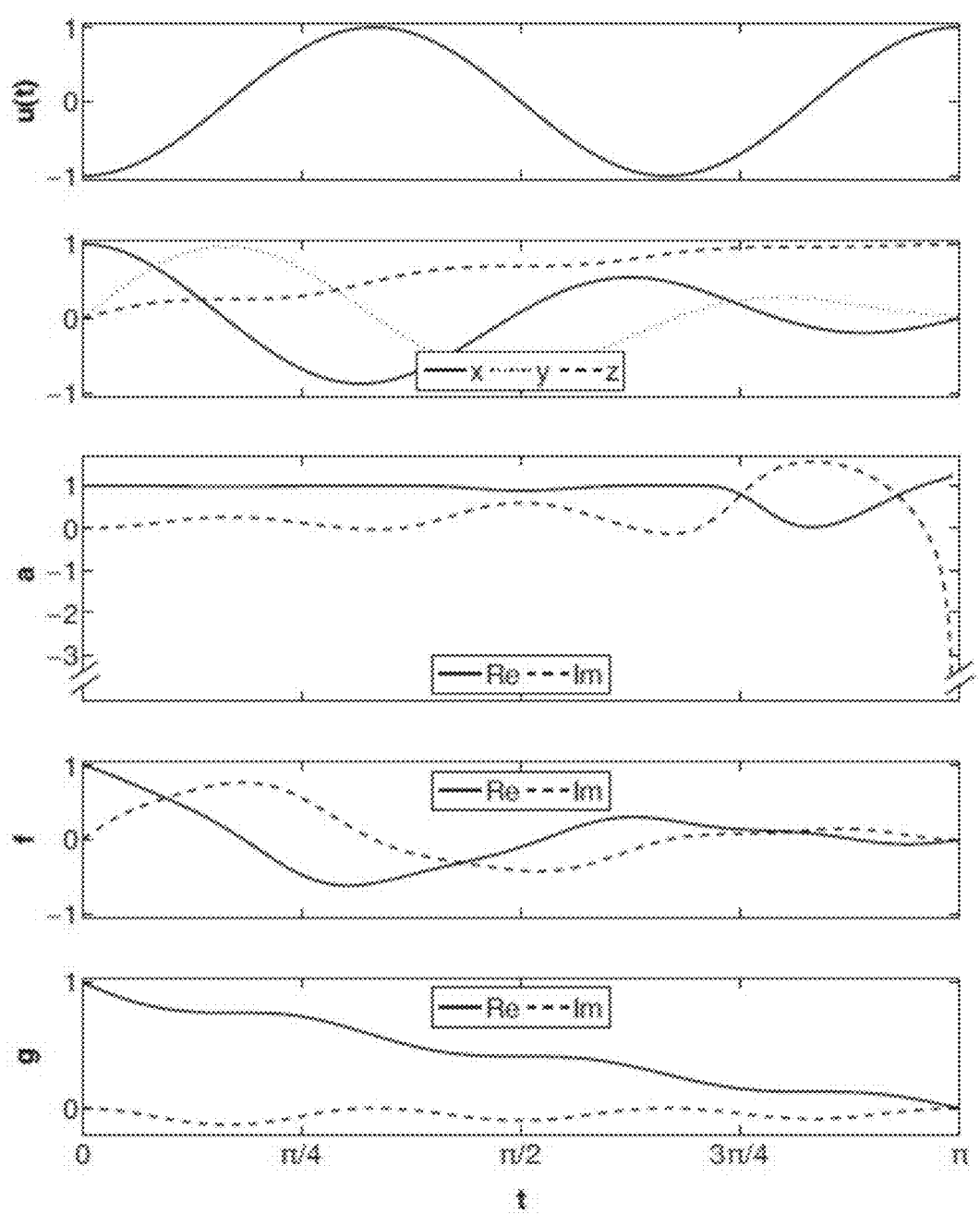
FIG. 4. From top to bottom, the minimum-energy control $u^*(t)=-\cos(3t)$ as in (7) for $\omega=3$ and $T=\pi$ and the corresponding spin trajectory $(x(t), y(t), z(t))$ and the evolutions of the complex-valued functions $a(t)$, $f(t)$, and $g(t)$ following $u^*(t)$. Note that the final state of $a$, $a(T)$, is large since $m(T)$ approaches to 0.

This result shows that a control that steers the spring modeled in (1) from $(\pi/2, 0)'$ to $(0, 0)'$, which satisfies (5), will drive the function f from f(0)=1 to f(T)=0. It follows that this steering control is a candidate $\pi/2$ pulse for the spin system, because, from (11), $$\begin{cases}(m(0), z(0))' = (1, 0)', & \text{when } f(0) = 1 \text{ with } a(0) = 1, \\ (m(T), z(T))' = (0, 1)', & \text{when } f(T) = 0, \text{ provided } a(T) < \infty,\end{cases} \quad (18)$$

which correspond to M(0)=(1, 0, 0)' and M(T)=(0, 0, 1)', respectively. Note that when m(T)=0, a(t) may have singular solutions at t=T, which will be analyzed in Section 2.2. An example minimum-energy control $u^*_{\pi/2}(t)=-\cos(3t)$, as expressed in (7) for $\omega$=3 and T=$\pi$, that steers the spring from $X_0=(\pi/2, 0)'$ to $X_F=(0, 0)'$, and the evolutions of a(t), f(t), and g(t) as described in (13), (14), and (15), respectively, resulting from this optimal control are illustrated in FIG. 4. Similarly, the same concept introduced above can be adopted to design a $\pi$ pulse, which is realized by constructing a control that steers the spring between $(\pi, 0)'$ and $(0, 0)'$ or simply by concatenating a $\pi/2$ pulse with its time-reversed version. The minimum-energy $\pi$ pulse, $u^*_\pi=-2\cos(3t)$, $t\in[0, \pi]$, and the resulting trajectories for the spring and the spin of $\omega$=3 and T=$\pi$ are illustrated in FIG. 5.

Section 2.2 Regular Singular Solutions of a(t)

The Riccati equation for a as in (13) can be reduced to a second order linear ordinary differential equation of the form [4]

$$\ddot{A}-R(t)\dot{A}+S(t)A=0, \quad (19)$$

where $$R(t) = -\frac{uz(\beta-1)}{m} + \frac{(\dot{u}\beta)}{u\beta} - \frac{\dot{m}}{m}, \quad (20)$$

$$S(t) = -\frac{u^2\beta(1+z^2-z^2\beta)}{4m^2}, \quad (21)$$

with the relation $$\frac{\dot{A}}{A} = a\frac{u\beta}{2m}. \quad (22)$$

Note that $\dot{A}(0)=\frac{1}{2}u(0)A(0)$ since $\beta(0)$=1, a(0)=1, and m(0)=1. In addition to the case m(T)=0 as in (18), the other possibility for $$f(T) = \frac{m(T)}{a(T)+z(T)} = 0$$

to hold is when a(T)=$\infty$.

This occurs when the coefficients of (19), i.e., R(t) and S(t) in (20) and (21), respectively, develop singularities at t=T, which in turn occurs when m(T)=0. Let $$L_1 = \lim_{t\to T}\{(T-t)R(t)\}, \quad (23)$$

$$L_2 = \lim_{t\to T}\{(T-t)^2 S(t)\}. \quad (24)$$

If both the limits L1 and L2 are finite, then t=T is a regular singular point. Note that since R(t) and S(t) are determined by the control variable u, one may expect to design a feasible control such that t=T is regular singular when m(T)=0. In this case, we can write (19) as $$\ddot{A} - \frac{P(t)}{t}\dot{A} + \frac{Q(t)}{t^2}A = 0, \quad (25)$$

where R(t)=P(t)/t and S(t)=Q(t)/$t^2$. Without loss of generality, we may assume that this regular singular point is transformed to t=0; or, equivalently, we redefine the time axis by letting t=t−T, so now t=0 represents t=T. Then, there exists a solution to (25) around the regular singular point, t=0, of the form (a Frobenius series) [4], $$A(t) = \sum_{k=0}^{\infty}\alpha_k t^{k+r}, \alpha_0 \neq 0, \quad (26)$$

where r is a definite (real or complex) constant, and this solution is valid in some interval 0<|t|<$\rho$, $\rho$>0. Plugging (26) into (25) yields $$\sum_{k=0}^{\infty}(k+r)(k+r-1)\alpha_k t^{k+r-2} - \quad (27)$$

$$\sum_{k=0}^{\infty}P(t)(k+r)\alpha_k t^{k+r-2} + \sum_{k=0}^{\infty}Q(t)\alpha_k t^{k+r-2} = 0.$$

Taking the series expansions for P(t)=$\Sigma_{i=0}^{\infty}p_i t^i$ and Q(t)=$\Sigma_{i=0}^{\infty}q_i t^i$ in (27) and collecting the coefficient of $t^{k+r-2}$ gives $$\sum_{k=0}^{\infty}[(k+r)(k+r-1)-P(t)(k+r)+Q(t)]\alpha_k t^{k+r-2} = 0, \quad (28)$$

which, for k=0, leads to the indicial equation, $$F(r)=r(r-1)-p_0 r+q_0=0, \quad (29)$$

since (28) holds for all k=0, 1, 2, . . . , and $\alpha_0 \neq 0$.

Furthermore, p0 and q0 in (29) can be represented in terms of the control variable and the state of the spin system. We first recall that m(T)=0, so we have x(T)=0, y(T)=0, and z(T)=1. Now, let's take the Taylor expansions for the state and control functions around the regular singular point, which is now t=0, to get $$u=u_0+u_1 t+u_2 t^2+\ldots, \quad (30)$$

$$x=x_1 t+x_2 t^2+x_3 t^3+\ldots, \quad (31)$$

$$z=1+z_1 t+z_2 t^2+\ldots, \quad (32)$$

where $x_0=x(T)=0$ and $z_0=z(T)=1$. Also, because, from the Bloch equations in (8) with $v=0$, $y=\omega x$, we obtain $$y(t) = y_0 + \int_0^t \omega x(\sigma) d\sigma = \int_0^t \omega(x_1\sigma + x_2\sigma^2 + \ldots)d\sigma = \frac{\omega x_1}{2}t^2 + \frac{\omega x_2}{3}t^3 + \ldots,$$

in which $y_0=y(T)=0$, and hence $$m = x + iy = x_1 t + \left(x_2 + i\frac{\omega x_1}{2}\right)t^2 + \left(x_2 + i\frac{\omega x_2}{3}\right)t^3 + \ldots. \quad (33)$$

In addition, integrating the z-component in the Bloch equations, which obeys $\dot{z}=-ux$, and employing (30) and (31) yields $$z = 1 - \frac{u_0 x_1}{2}t^2 - \frac{u_0 x_2 + u_1 x_1}{3}t^3 - \frac{u_0 x_3 + u_1 x_2 + u_2 x_1}{4}t^4 - \ldots.$$

Using the definitions in (20) and (21) and the relations $R(t)=P(t)/t=\Sigma_{i=0}^{\infty} p_i t^i/t$ and $S(t)=Q(t)/t^2=\Sigma_{i=0}^{\infty} q_i t^i/t^2$ together with the expressions derived in (30), (32), (33), we obtain $$p_0 = \frac{u_0(1-\beta_0)}{x_1} - 1, \quad q_0 = \frac{u_0^2 \beta_0 (\beta_0 - 2)}{4x_1^2}, \quad (34)$$

where $\beta = e^{2i\omega t} = \beta_0 + \beta_1 t + \beta_2 t^2 + \ldots$ with $\beta_0 = \beta(T) = e^{2i\omega T}$. Therefore, the indicial equation associated with the second-order ordinary differential equation (19) is given by $$F(r) = r^2 - \frac{u_0(1-\beta_0)}{x_1}r + \frac{u_0^2 \beta_0 (\beta_0 - 2)}{4x_1^2} = 0. \quad (35)$$

Section 2.3 Control Synthesis for Regular Singular Solutions

Given the expression in (35), we can design controls (pulses) and choose their durations to manipulate the indicial equation and thus the regular singular solution of (19) around the regular singular point, that is, $t=0$. The indicial equation in (35) has two roots, given by $$r_1 = \frac{u_0(2-\beta_0)}{2x_1}, \quad r_2 = \frac{-u_0 \beta_0}{2x_1}. \quad (36)$$

Recall that $x_1 = \dot{x}(T)$ and $u_0 = u(t)$. We may now show that $a(T)$ is finite, provided $x_1 \neq 0$ and $u_0 \neq 0$.

Lemma 1 If $u_0 = u(T) \neq 0$ and the resulting x-trajectory has a non-vanished derivative at $t=T$, i.e., $x_1 = \dot{x}(T) \neq 0$, then $a(T) < \infty$.

Proof. Because $u_0 \neq 0$ and $x_1 \neq 0$, we have $r_1 \neq 0$, $r_2 \neq 0$, and $$r_1 - r_2 = \frac{u_0}{x_1}$$

from (36). The regular singular solution to the differential equation (19) depends on the relation of $r_1-r_2$, which leads to two cases.

Case I: $|r_1-r_2| = Z_+$. We first examine the situation when $r_1 > r_2$, i.e., $u_0 = \zeta x_1$, where $\zeta$ is a positive integer. Then, the equation (19) has two nontrivial linearly independent solutions of the form $A_1(t) = t^{r_1} h_1(t)$ where $h_1(t) = \Sigma_{i=0}^{\infty} c_i t^i$ with $c_0 \neq 0$, and $A_2(t) = t^{r_2} h_2(t) + cA_1(t) \ln t$, where $h_2(t) = \Sigma_{i=0}^{\infty} d_i t^i$ with $d_0 \neq 0$, and c is a constant that may or may not be 0. The general solution of (19) is $A(t) = k_1 A_1(t) + k_2 A_2(t)$, where $k_1, k_2 \in \mathbb{R}$. Then, we can compute the limit $$\lim_{t \to 0} \frac{t\dot{A}(t)}{A(t)} = \lim_{t \to 0} \frac{t[k_1 \dot{A}_1 + k_2 \dot{A}_2]}{k_1 A_1 + k_2 A_2}$$

$$= \lim_{t \to 0} \frac{tk_1(r_1 h_1 t^{r_1-1} + \dot{h}_1 t^{r_1}) + tk_2 c(r_1 h_1 t^{r_1-1} + \dot{h}_1 t^{r_1})}{k_1 h_1 t^{r_1} + k_2 c h_1 t^{r_1} \ln t + k_2 h_2 t^{r_2}}$$

$$\quad + \frac{\ln t + k_2 c h_1 t^{r_1} + k_2 r_2 h_2 t^{r_2} + k_2 \dot{h}_2 t^{r_2+1}}{}$$

$$= \lim_{t \to 0} \frac{k_1(r_1 h_1 t^{r_1-r_2} + \dot{h}_1 t^{r_1+1-r_2}) + k_2 c(r_1 h_1 t^{r_1-r_2} + \dot{h}_1 t^{r_1+1-r_2})}{k_1 h_1 t^{r_1-r_2} + k_2 c h_1 t^{r_1-r_2} \ln t + k_2 h_2}$$

$$\quad + \frac{\ln t + k_2 c h_1 t^{r_1-r_2} + k_2 r_2 h_2 + k_2 \dot{h}_2 t}{} \quad (37)$$

provided $k \neq 0$. By the transformation $$a(t) = \frac{2m\dot{A}}{u\beta A}$$

from (22) with (33) and (37), we obtain the limit of $a(t)$, $$\lim_{t \to 0} a(t) =$$

$$\lim_{t \to 0} \frac{2(x_1 t + \ldots)\dot{A}}{(u_0 + u_1 t + \ldots)(\beta_0 + \beta_1 t + \ldots)A} = \frac{2x_1 r_2}{u_0 \beta_0} = \frac{2x_1\left(\frac{-u_0 \beta_0}{2x_1}\right)}{u_0 \beta_0} = -1,$$

where we employed (30) and (31).

If $r_2 > r_1$, i.e., $u_0 = -\zeta x_1$ with $\zeta \in Z_+$, then the two linearly independent solutions of (19) are of the form $A_1(t) = t^{r_2} h_1(t)$ and $A_2(t) = t^{r_1} h_2(t) + cA_1(t) \ln t$. Similar calculations as in (37) give $$\lim_{t \to 0} \frac{t\dot{A}(t)}{A(t)} = r_1$$

and thus $$\lim_{t\to 0} a(t) = \frac{2x_1 r_1}{u_0 \beta_0} = \frac{2x_1\left(\frac{u_0(2-\beta_0)}{2x_1}\right)}{u_0 \beta_0} = \frac{2-\beta_0}{\beta_0}.$$

Combining the above two cases, we conclude that $$\lim_{t\to 0} a(t) = \begin{cases} \frac{2-\beta_0}{\beta_0}, & \text{if } \frac{u_0}{x_1} < 0, \\ -1, & \text{if } \frac{u_0}{x_1} > 0, \end{cases}$$

where $\beta_0 = \beta(T) = e^{2i\omega T}$. Furthermore, let $$\eta = \frac{2-\beta_0}{\beta_0},$$

then we have $|\eta|=|2-\beta 0|=$ where $\beta 0=\beta(T)=e2i\omega T$. Furthermore, let $\eta=2-\beta_0$, then we have $|n|=|2-\beta_0|=\sqrt{5-4\cos(2\omega T)}$. Therefore, $\eta$ is bounded by $1\leq|\eta|\leq 3$, and $|\eta|=1$ when $T=n\pi/\omega$, and $|\eta|=3$ when $T=(2n+1)\pi/(2\omega)$, where $n=0, 1, 2, \ldots$.

Case II: $r1-r2\neq 0$ or $|r1-r2|\neq Z^+$. In this case, the equation (19) has a general solution of the form $A(t)=k_1 A_1(t)+k_2 A_2(t)$, where $$A_1(t)=t^{r_1}h_1(t),$$

in which $h_1(t)=\Sigma_{i=0}^\infty c_i t^i$ with $c_0 \neq 0$, and $$A_2(t)=t^{r_2}h_2(t),$$

in which $h_2(t)=\Sigma_{i=0}^\infty d_i t^i$ with $d_0 \neq 0$. Similar calculations as described in Case I lead to the same result, that is, $$\lim_{t\to 0} a(t) = \begin{cases} \frac{2-\beta_0}{\beta_0}, & \text{if } \frac{u_0}{x_1} < 0, \\ -1, & \text{if } \frac{u_0}{x_1} > 0, \end{cases}$$

so that $1\leq |\lim_{t\to 0}\alpha(t)|\leq 3$.

To conclude, in this section, we illustrate that if the limits L1 and L2 defined in (23) and (24), respectively, exist, then the second-order differential equation A in (19) has a regular singular solution at $t=T$ and $a(T)$ is finite. This implies that when $f(T)=0$, it must be $m(T)=0$ as desired. Moreover, the regular singular solution depends on the control design, because u0 and x1, which results from u0, determine the indicial equation. Ideally, one can design an admissible control input, satisfying the integral condition in (5), such $u_0=u(T)\neq 0$, $x_1=\dot{x}(T)\neq 0$, and $t=T$ is a regular singular point. With these conditions fulfilled, the control function $u(t)$ for $t\in[0, T]$ drives the spin from $e1=(1, 0, 0)'$ to $e3=(0, 0, 1)'$, and hence the time-reversed and sign-inverted control function $\tilde{u}(t)=-u(T-t)$ for $t\in[0, T]$ is a $\pi/2$ pulse that excites the spin from the equilibrium state $e_3$ to the excited state $e_1$.

Section 2.4 Asymptotic Exactness

Figure 6:
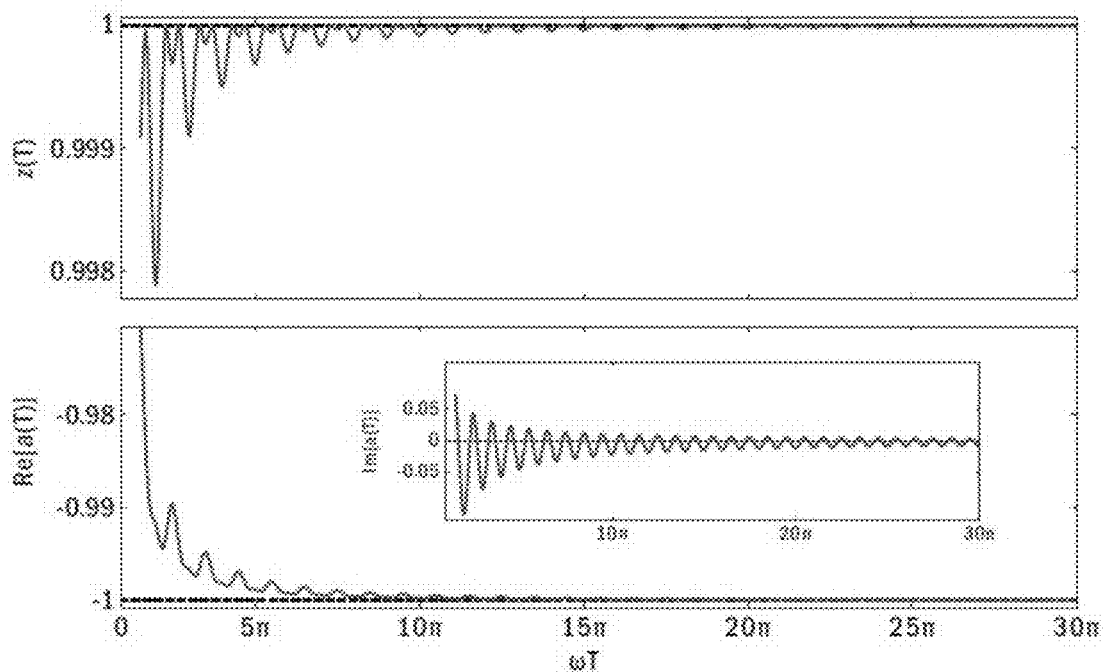
FIG. 6. The minimum energy control $u^*(t)$ evidences improving final z magnetization as the product $\omega T$ increases. An alternative derivation provides insight into why this is by revealing that the asymptotic behavior of $a(T)$ drives this performance improvement. For example, when $\omega T=30\pi$, $z(T)=0.99999$.

A curious, but important, characteristic of the spin trajectory corresponding to the minimum energy control pulse—and, therefore, a characteristic of the mapping between spin and spring—is that the performance (the closeness of the final z magnetization to 1) approaches 1 as the product $\omega T$ increases, i.e., as either or both the frequency of the Bloch system or the duration of the minimum energy pulse increases (see FIG. 6). The numerical experiments shown in FIG. 6 indicate that as the value of $\omega T$ increases, $a(T)$ asympototically approaches being a regular singular point, which yields finite values of $a(T)$ and forces the asymptotic behavior $z(T)\to 1$. Therefore, the framework we establish in this paper quantifies sufficient conditions for asymptotic exactness. In some contexts our approach may yield arbitrarily exact excitation pulses; in other applications which require restricted durations, our findings provide almost exact excitation pulses with a guide for the relationship between performance, duration, and frequency.

Section 2.5 An Alternative Dynamic Mapping

We now discuss an alternative dynamic mapping scenario that permits the use of two controls in the analysis and provides a different perspective on the dynamic connection between the spring and the spin, in particular, delivering an explanation for the asymptotic behavior of the performance $z(T)$, through the asymptotic behavior of $a(T)$. If, instead of using (13), $a(t)$ is chosen such that $$\frac{1}{2}\overline{\alpha} + \frac{\overline{\alpha}(1-a^2)-2m\dot{a}}{2(a+z)^2} = 0,$$

with the initial condition $a(0)=1$, namely, $a(t)$ satisfies the differential equation $$\dot{a} = \frac{\overline{\alpha}}{2m}(2za + z^2 + 1), \quad a(0) = 1, \tag{38}$$

then f follows $$\dot{f} = i\omega f + \tfrac{1}{2}\alpha f^2, \tag{39}$$

with $f(0)=1$ since $m(0)=1$, $z(0)=0$, and $a(0)=1$. Similar to the derivation in Section 2.1, let $g(t)=e-i\omega t f(t)$, then it follows that $$\dot{g} = \tfrac{1}{2}g^2 \alpha e^{i\omega t}, \tag{40}$$

and, furthermore, $$\int_{g_0}^{g_1} \frac{2}{g^2} dg = \int_0^T \alpha e^{i\omega t} dt, \tag{41}$$

$=g(0)=1$ and $g1=g(T)$. One can show that the line integral $$\int_\gamma \frac{2}{g^2} dg$$

is independent of the path $\gamma$ that starts with $g_0=1$ and ends at $g1=c+id$ with $c, d\in\mathbb{R}$. Let c1 and c2 be two non-homotopic loops in $C\backslash\{0\}$, and let D1 and D2 denote the regions inside C1 and C2, respectively. Without loss of generality, we assume that $0\notin D1$ but $0\in D2$. Therefore, C1 is homologous to 0, and the integrand $2/g^2$ is analytic on D1. Hence, we have $$\int_{C_1} \frac{2}{g^2} dg = 0,$$

and, in addition, the Cauchy's integral formula gives $$\int_{C_2} \frac{2}{g^2} dg = \frac{n(C_2, 0)}{2\pi i} \frac{d}{dg}\bigg|_{g=0} 2 = 0,$$

where $n(C_2, 0)$ denotes the winding number of $C_2$ with respect to 0. As a result, the integral $$\int_C \frac{2}{g^2} dg = 0$$

over any loop C, and thus it is path-independent.

Now, consider a path $\gamma$ along the real axis from $g_0=1$ to c and then align the imaginary axis from c to $g_1=c+id$, then the line integral $$\int_\gamma \frac{2}{g^2} dg = \quad (42)$$

$$\int_1^c \frac{2}{x^2} dx + \int_0^d \frac{2}{(c+iy)^2} d(iy) = 2\left(1 - \frac{c}{c^2+d^2} + i\frac{d}{c^2+d^2}\right).$$

If the control function satisfies (5), then we obtain, using (41) and (42), $$d=0, 2(c-1)/c=-\pi/2. \quad (43)$$

This gives $$g_1 = \frac{4}{4+\pi}, \text{ and } f(T) = \frac{4}{4+\pi} e^{i\omega t}.$$

If, in addition, the control drives $a(T) \to -1$, then $$\frac{4}{4+\pi} e^{i\omega T} = f(T) = \frac{m(T)}{a(T)+z(T)} = \frac{x_1+iy_1}{z_1-1},$$

where $x_1=x(T)\in\mathbb{R}$, $y_1=y(T)\in\mathbb{R}$, and $z_1=z(T)\in\mathbb{R}$, with $z_1^2=1-x_1^2-y_1^2$. Solving this yields two real solutions $$(i) \; x_1 = 0, \; y_1 = 0, \; z_1 = 1 \quad (44)$$

$$(ii) \; x_1 = -\frac{8(4+\pi)\cos(\omega T)}{\pi(8+\pi)+32}, \; y_1 = -\frac{8(4+\pi)\sin(\omega T)}{\pi(8+\pi)+32},$$

$$z_1 = -\frac{\pi(8+\pi)}{\pi(8+\pi)+32},$$

and solution (ii) can be omitted since $z(T)>0$ by the application of the control u that satisfies (5). This can be seen by considering the case of $\omega=0$, where following the control satisfying (5), the spin is steered from $(1, 0, 0)'$ to $(0, 0, 1)'$ at time T. A continuity argument in w may lead to the required conclusion.

It follows that this steering control is a candidate $\pi/2$ pulse for the spin system, because, from (11), $$\begin{cases} (m(0), z(0))' = (1, 0)', & \text{when } f(0) = 1 \text{ with } a(0) = 1, \\ (m(T), z(T))' = (0, 1)', & \text{when } f(T) = \frac{4}{4+\pi} e^{i\omega T}, \text{ with } a(T) = -1, \end{cases} \quad (45)$$

which correspond to $M(0)=(1, 0, 0)'$ and $M(T)=(0, 0, 1)'$, respectively.

Figure 7:
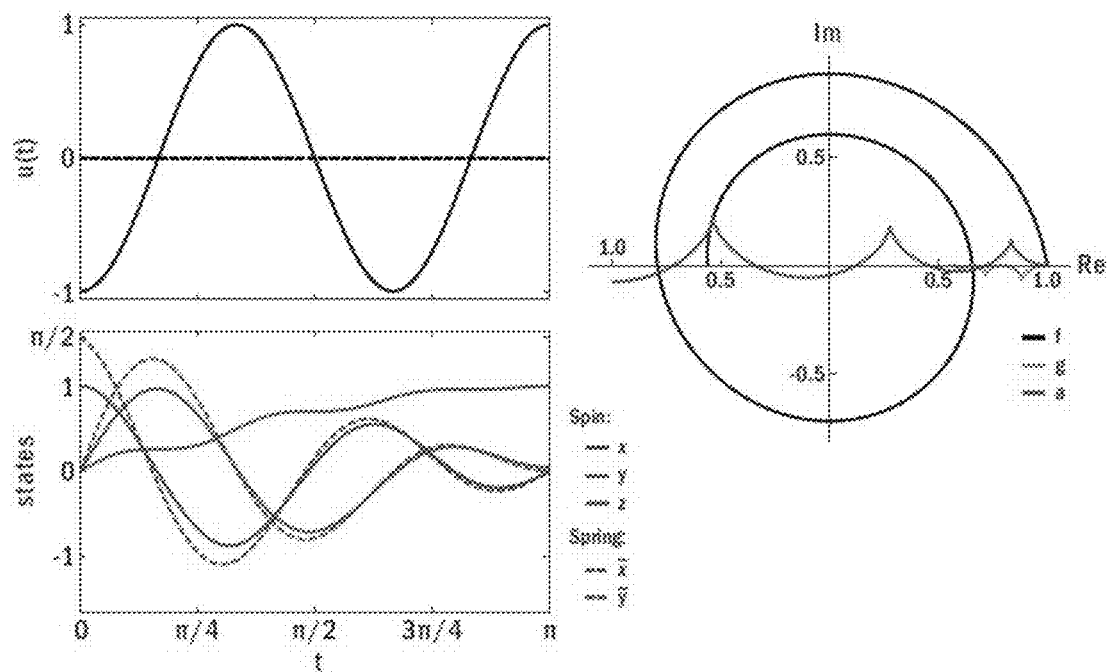
FIG. 7. The minimum energy control $u^*(t)=-\cos(3t)$ as in (7) for $\omega=3$ and $T=\pi$, the corresponding spin $(m(t), z(t))$ and spring $X(t)$ trajectories, and the evolutions of the complex-valued functions $f(t)$, $g(t)$, and $a(t)$ following $u^*(t)$. Since the minimum energy control $u^*(t)$ satisfies (5), the final value of g is close to $g(T) \approx 4/(4+\pi) \approx 0.56$. The control also drives $a(T) \approx -1$. The integral condition guarantees the spring is driven to zero and when $u^*(t)$ additionally satisfies $a(T) \to -1$ the spin is driven to the +z pole.

Numerical calculations show that following the example minimum-energy control $u^*\pi/2(t)=-\cos(3t)$ expressed in (7) for $\omega=3$ and $T=\pi$, the final state $a(T)\to-1$ asymptotically with respect to the final time T—the length of the pulse—(see FIG. 6), and the spin is steered from $(1, 0, 0)'$ asymptotically to $(0, 0, 1)'$. The evolutions of $a(t)$, $f(t)$, and $g(t)$ as described in (38), (39), and (40), respectively, resulting from this optimal control are illustrated in FIG. 7.

Moreover, we observe empirical evidence (see FIG. 8) that the correlation between the spin rotation angle and the initial state of the harmonic oscillator seem to be an exact correspondence.

We have proven that driving the harmonic oscillator from $(\pi/2, 0)'$ to $(0, 0)'$ achieves a $\pi/2=90°$ rotation of the spin vector. By simulation we see that driving the spring from $(\pi/4, 0)'$ instead corresponds to a rotation of the spin vector by $\pi/4=45°$. Thus, we conjecture that any total rotation $\gamma$ in the x-z plane) can be reached by satisfying, $$2\left(\frac{c-1}{c}\right) = -\gamma \Rightarrow g_1 = \frac{2}{2+\gamma},$$

according to (43), where $(\gamma, 0)'$ is the initial state of the spring and state of the spin.

Section 2.6 Complex Representation of the Spring Driven by Two Controls

In the preceding section, the alternative derivation provided a proof that allowed both controls of the spin (u and v) to be nonzero, i.e., $\alpha=u+iv$ was left general. This provides an opportunity to connect the full Bloch equations of the spin to the case where the spring is driven by two controls as well. This provides a clearer explanation of the correspondence between spin and spring. We consider the system (1) with a second control that directly forces the position term of the harmonic oscillator, $$\frac{d}{dt}\begin{bmatrix} \tilde{x}(t) \\ \tilde{y}(t) \end{bmatrix} = \begin{bmatrix} 0 & -\omega \\ \omega & 0 \end{bmatrix}\begin{bmatrix} \tilde{x}(t) \\ \tilde{y}(t) \end{bmatrix} + \begin{bmatrix} 1 & 0 \\ 0 & 1 \end{bmatrix}\begin{bmatrix} u(t) \\ v(t) \end{bmatrix}. \quad (46)$$

A compact expression for (46) is provided by complex notation with $$\tilde{m}(t)=\tilde{x}(t)+i\tilde{y}(t), \; \alpha(t)=u(t)+iv(t),$$

$$\dot{\tilde{m}}=i\omega\tilde{m}+\alpha. \quad (47)$$

We can develop analogous conditions for the transfer from $$\tilde{m}(0) = \frac{\pi}{2} \text{ to } \tilde{m}(T) = 0 \text{ since,}$$

-continued $$\tilde{m}(T) = 0 = e^{i\omega T}\frac{\pi}{2} + \int_0^T e^{i\omega(T-t)}\alpha(t)dt$$

$$-\frac{\pi}{2} = \int_0^T \alpha(t)e^{-i\omega t}dt \qquad (48)$$

$$= \underbrace{\int_0^T [u(t)\cos(\omega t) + v(t)\sin(\omega t)]dt}_{=-\frac{\pi}{2}} + \qquad (49)$$

$$\underbrace{i\int_0^T [v(t)\cos(\omega t) - u(t)\sin(\omega t)]dt}_{=0}.$$

We observe that (48) (spring, two controls) differs from (5) (spring, one control) by the sign of the exponential term. More importantly, we note that (48) differs from (41) (spin, two controls). This means that in the general two control case, the conditions for spin and spring no longer coincide without additional criteria. We observe that the single control case, in which v(t)=0, is a simple way (sufficient condition) to make these two expressions equivalent. However, it is instructive to identify the necessary and sufficient conditions for (48) and (41) to be equivalent in the general case when two controls are allowed, i.e., establish when $$\underbrace{\int_0^T \alpha(t)e^{-i\omega t}dt}_{spring\ (48)} = \underbrace{\int_0^T \alpha(t)e^{i\omega t}dt}_{spin\ (41)}. \qquad (50)$$

These integral conditions coincide if and only if $$\int_0^T u(t)\sin(\omega t)dt = 0, \qquad (51)$$

$$\int_0^T v(t)\sin(\omega t)dt = 0, \qquad (52)$$

Again, in the case of a single control, v(t)=0 guarantees (52) and the design of u(t) to satisfy (4) guarantees (51). In the general case, (51) and (52) identify the additional criteria required to design controls that simultaneously drive the spin and spring.

The general minimum energy control that achieves the desired transformation using two controls can be computed as $$\alpha(t) = e^{-i\omega t}W^{-1}\left(-\frac{\pi}{2}\right) = -\frac{\pi}{2T}e^{-i\omega t} = \underbrace{-\frac{\pi}{2T}\cos(\omega t)}_{u(t)} + i\underbrace{\left(-\frac{\pi}{2T}\sin(\omega t)\right)}_{v(t)}, \qquad (53)$$

where the controllability grammian is given by $$W = \int_0^T e^{-i\omega t}e^{i\omega t}dt = T,$$

since in the context of complex numbers A' in the previous definition becomes A†, i.e., the conjugate transpose of A. However, this minimum energy control differs from the expression in (6) because it assumes two controls, whereas (6) assumes only one control.

We further observe, without a formal proof, that due to the linearity of the spring, we can easily design controls to start from initial states that have nonzero imaginary part $$\left(\text{e.g., } \tilde{m}(0) = \frac{\pi}{2\sqrt{2}} + i\frac{\pi}{2\sqrt{2}}\right)$$

by independently designing u(t) to accomplish the transfer for the real part, i.e., $$\tilde{m}(0) = \frac{\pi}{2\sqrt{2}}$$

and v(t) to accomplish the transfer for the imaginary part, i.e.

$$\tilde{m}(0) = i\frac{\pi}{2\sqrt{2}}{}^1.$$

Importantly—and different from the two-control minimum energy control (53)—this independent design of u(t) and v(t) automatically satisfies both (51) and (52). Therefore, when designed independently in this manner, the combined controls also become controls for the spin (e.g., driving the spin from

[1] For a spin magnetization described in spherical coordinates with radial distance ρ=1, azimuthal angle θ, and polar angle φ, the spin cartesian coordinates are M=(cos θ sin φ, sin θ sin φ, cos φ)' (simply transforming from spherical to cartesian coordinates). Here φ represents the angle that the spin vector must be rotated to bring it to the final state (0, 0, 1)'. The case in the manuscript considers a rotation of π/2. At the end of Section 2.5 we discussed the extension to design a single control that generates an arbitrary flip angle γ along either the x or y axes. Now with two controls we can accommodate any flip angle along any arbitrary direction. The corresponding spring state captures the fact that the overall spin rotation is φ, but is shared between the two controls (which is specified by the angle θ): m̃=φ cos θ+i φ sin θ. Therefore, while φ is the total rotation angle of the spin achieved by both controls applied together, the effective rotation that each control must generate is φ cos θ for the u control and φ sin θ for the v control.

$$M(0) = \left(\frac{1}{\sqrt{2}}, \frac{1}{\sqrt{2}}, 0\right)$$

to M(T)=(0, 0, 1)'). Specifically, a general transfer, i.e., from m̃(0)→m̃(T) can be achieved by designing u(t) and v(t) to satisfy $$\int_0^T u(t)\cos(\omega t)dt = \tilde{m}(T)\cos(\omega T) - \tilde{m}(0),\ \int_0^T u(t)\sin(\omega t)dt = 0, \qquad (54)$$

$$\int_0^T v(t)\sin(\omega t)dt = 0,\ \int_0^T v(t)\cos(\omega t)dt = -\tilde{m}(T)\sin(\omega T), \qquad (55)$$

This approach aligns with the fact that v(t)=0 when the imaginary part of m̃(0) is zero (the case considered in the main manuscript and first proof). FIG. 8 depicts an example of such a control and the corresponding state trajectories.

Section 3 Validation of the Dynamic Transformation

Because the dynamic transformation f: [0, T]→C as in (11) may correspond to an invalid spin trajectory, i.e., a complex-valued trajectory, depending on a(t), which in turn depends on the applied control u(t), it is then essential to examine conditions under which f(t) with f(0)=1 uniquely determines a Bloch trajectory (x(t), y(t), z(t))' on the unit sphere for t∈[0, T]. Let f(t)=f1(t)+if2(t) and a(t)=a1(t)+ia2(t), and then from (11) we have $$f_1(t) + if_2(t) = \frac{x(t) + iy(t)}{a_1(t) + ia_2(t) + z(t)}, \qquad (56)$$

for all t∈[0, T]. Since (x, y, z)' is a Bloch vector, it satisfies, for all t∈[0, T], $$x^2(t) + y^2(t) + z^2(t) = 1. \qquad (57)$$

Solving (56) and (57) for (x, y, z)' yields, $$x_1 = f_1(a_1 + z_1) - a_2 f_2, \quad (58)$$
$$y_1 = a_2 f_1 + f_2(a_1 + z_1),$$
$$z_1 = \frac{a_1 - D}{1 + |f|^2} - a_1,$$

or $$x_2 = f_1(a_1 + z_2) - a_2 f_2,$$
$$y_2 = a_2 f_1 + f_2(a_1 + z_2),$$
$$z_2 = \frac{a_1 + D}{1 + |f|^2} - a_1,$$

Where $D=\sqrt{-a_2^2|f|^4+(1-|\alpha|^2)|f|^2+1}$ and where $|f|^2=f_1^2+f_2^2$ and $|\alpha|^2=\alpha_1^2+\alpha_2^2$.

Therefore, it requires that the discriminant is positive i.e., $$-a_2^2|f|^4+(1-|\alpha|^2)|f|^2+1>0, \quad (59)$$

in order for $(x_i(t), y_i(t), z_i(t))'$ to be a Bloch trajectory. Employing the initial conditions $f(0)=1$ and $a(0)=1$, i.e., $f_1(0)=1$, $f_2(0)=0$, $a_1(0)=1$, and $a_2(0)=0$, the corresponding Bloch trajectory can be uniquely determined in terms of $f(t)$ and $a(t)$, which is $(x_2(t), y_2(t), z_2(t))'$ for $t \in [0, T]$ as in (58), because $(x_2(0), y_2(0), z_2(0))'=(1, 0, 0)'$. Note that the discriminant in (59) must be strictly positive, because if it is equal to zero, then $D=0$ implies $(x_1, y_1, z_1)'=(x_2, y_2, z_2)'$ for all $t\in[0, T]$, which gives an invalid initial condition $(½, 0, -½)'$. Furthermore, it follows from (59) that the necessary and sufficient condition for $z_2$ to be real, and hence $(x_2(t), y_2(t), z_2(t))'$ a valid Bloch trajectory, is $$0 \leq |f|^2 < \frac{1-|a|^2 + \sqrt{(1-|a|^2)^2 + 4a_2^2}}{2a_2^2}, \quad (60)$$

which determines the regime where the dynamic transformation f determines a valid spin trajectory with respect to an applied control field. Finally, we note that if $a(t) \equiv 1$ for all $t \in [0, T]$, then $D=1$, $z_1=-1$ (the south pole), and $$z_2 = \frac{1-f\bar{f}}{1+f\bar{f}} = \frac{1-|f|^2}{1+|f|^2},$$

which is the Stereographic projection.

To illustrate the importance of the bound on the dynamic projection f(t), in FIG. 9 we plot the time evolution of D for the minimum-energy control and several counterexample controls, which satisfy the integral condition in (5), but not the bound in (60). Note that all controls steer the spring from $(\pi/2, 0)'$ to $(0, 0)'$ but only when (60) is satisfied, as in the case of the minimum energy control, does the control also steer the spin from $(1, 0, 0)'$ to $(0, 0, 1)'$.

Section 4 Broadband Pulse Design Via Steering Springs

As described in Section 2 and 3, the design of excitation and inversion pulses that manipulate the spin magnetization at a single frequency ω can be mapped into a problem of steering springs, for which finding analytical expressions of optimal steering controls is a straightforward manner. It follows from this new finding that a control simultaneously steering a family of springs over a defined bandwidth between $(0, 0)'$ and $(\pi/2, 0)'$ (or $(\pi, 0)'$) is a broadband $\pi/2$ (or $\pi$) pulse, respectively.

Section 4.1 Analytic Broadband Pulse Design

Analytic broadband pulses can be constructed through studying the steering problem of an ensemble of harmonic oscillators, given by $$\frac{d}{dt}\begin{bmatrix} x(t, \omega) \\ y(t, \omega) \end{bmatrix} = \begin{bmatrix} 0 & -\omega \\ \omega & 0 \end{bmatrix}\begin{bmatrix} x(t, \omega) \\ y(t, \omega) \end{bmatrix} + \begin{bmatrix} u(t) \\ v(t) \end{bmatrix}. \quad (61)$$

where $\omega \in [\omega 1, \omega 2] \subset R$. The minimum-energy ensemble control that drives this spring ensemble from an initial state $X0(\omega)=(x(0, \omega), y(0, \omega))'$ to a desired final state $XF(\omega)=(x(T, \omega), y(T, \omega))'$ at a prescribed time $T<\infty$ and minimizes the total energy of the control fields, i.e., $J=\int_0^T[\hat{u}(t)^2+v(t)^2]dt$, was derived in our previous work, and the mathematical details can be found in [5]. A brief description is provided below in this section.

Let $$p(t,\omega)=x(t,\omega)+iy(t,\omega),$$

$\alpha(t)=u(t)+iv(t)$, the system (61) is then transformed to a complex system, $p'(t, \omega)=i\omega p(t, \omega)+\alpha(t)$, with the initial state $p(0, \omega)=x(0, \omega)+iy(0, \omega)$. Without loss of generality, we consider the case in which the frequencies are symmetric to the origin, i.e., $\omega \in [-\beta, \beta]$. By the variation of constants formula, we have at time T $$p(T, \omega)=e^{i\omega T}p(0,\omega)+\int_0^T e^{i\omega(T-\tau)}\alpha(\tau)d\tau, \quad (62)$$

for all $\omega \in [-\beta, \beta]$, and this gives $$\int_0^T e^{-i\omega\tau}\alpha(\tau)d\tau = e^{-i\omega T}p(T,\omega)-p(0,\omega) \doteq \xi(\omega). \quad (63)$$

Let $H_1=L_2[0, T]$ and $H_2=L_2[-B, B]$ be Hilbert spaces over C. Defining the linear operator $L: H_1 \to H_2$ by $$(L\alpha)(\omega)=\int_0^T e^{-i\omega\tau}\alpha(\tau)d\tau, \quad (64)$$

it follows from (63) and (64) that $$(L\alpha)(\omega)=\xi(\omega). \quad (65)$$

It can be shown that the operator L is compact and that the minimum norm solution of (65), which corresponds to the minimum-energy control $\alpha^*$, is given by $$\alpha^*(t) = \int_{-\beta}^{\beta} e^{i\omega t} \sum_{n=1}^{\infty} \frac{1}{\lambda_n} \langle \xi, \tilde{\phi}_n \rangle \tilde{\phi}_n d\omega, \quad (66)$$

where $$\tilde{\phi}_n = e^{-i\omega\frac{T}{2}} \frac{\psi_n}{\|\psi_n\|}$$

and $\lambda n=2\pi\kappa n$, in which $\psi n$ are the prolate spheroidal wave functions (pswf's) and $\kappa_n>0$ are the associated eigenvalues [6, 7, 8]. The control $\alpha^*$ that steers the spring ensemble from $p(0, \omega)=\pi/2$ to $p(T, \omega)=0$ is a broadband $\pi/2$ pulse and that drives the ensemble from $p(0, \omega)=\pi$ to $p(T, \omega)=0$ is a broadband $\pi$ pulse. A truncated optimal control $$\alpha_N(t) = \int_{-\beta}^{\beta} e^{i\omega t} \sum_{n=1}^{N(\varepsilon)} \frac{1}{\lambda_n} \langle \xi, \tilde{\phi}_n \rangle \tilde{\phi}_n \, d\omega,$$

will steer the ensemble (61) from $p(0, \omega)$ to be within an $\varepsilon$-neighborhood of the desired final state, namely, $B_\varepsilon(p_F(\omega))=\{h\in \mathcal{H}_2: \|p_F(\omega)-h(\omega)\|_2<\varepsilon\}$ at time T, where the size of $\varepsilon$ defines the tolerance of the pulse performance.

Section 4.2 Numerical Synthesis of Broadband Pulses

Note that the pswf's can be approximated by the discrete prolate spheroidal sequences (dpss's), denoted $\{v_{t,k}(N,W)\}$ which are defined via the solution to the following algebraic equation [7, 9]

$$\sum_{t'=0}^{N-1} \frac{\sin[2\pi W(t-t')]}{\pi(t-t')} v_{t',k}(N, W) = \lambda_k(N, W) v_{t,k}(N, W),$$

where $0<W<\frac{1}{2}$ and $t=0, 1, \ldots, N-1$. The minimum-energy ensemble control $\alpha^*$ as in (66) and its truncation $\alpha N(t)$ can be easily calculated numerically using the discrete prolate spheroidal sequences in most scientific programming tools, e.g., the MATLAB command "dpss". A broadband $\pi$ pulse that produces uniform excitation over the designed bandwidth is shown in FIG. 10. In addition, this optimal control can also be effectively obtained via finding the minimum-norm solution to the integral equation (64) using the recently developed SVD-based algorithm [10].

Section 4.2.1 Design of Constrained Broadband Pulses

In practice, the amplitude or power of RF pulses may be limited. Such constrained broadband pulse design can be formulated as a minimization problem, where we wish to steer the spring ensemble $p(0, \omega)=\pi/2$ or $p(0, \omega)=\pi$ to $p_F(\omega)=0$, given by $$\min_{u,v} \int_{-B}^{B} \|p(T, \omega) - p_F(\omega)\|^2 d\omega, \quad (67)$$

$$\text{s.t. } u^2(t) + v^2(t) \leq A_{max}^2, \quad (68)$$

where $A_{max}$ is the maximum allowable amplitude. Note that $p(T, \omega)$ depends on the control $\alpha=u+iv$ as defined in (62). When $v=0$, this optimal control problem, following some algebraic manipulations, can be reduced to a convex optimization problem of the form $$\min_u \int_0^T \left[ \int_0^T \frac{\sin[\beta(\tau-\sigma)]}{\tau-\sigma} u(\tau)u(\sigma)d\sigma + \frac{2\sin(\beta\tau)}{\tau} u(\tau) \right] d\tau \quad (69)$$

$$\text{s.t. } u^2(t) \leq A_{max}^2.$$

Figure 3:
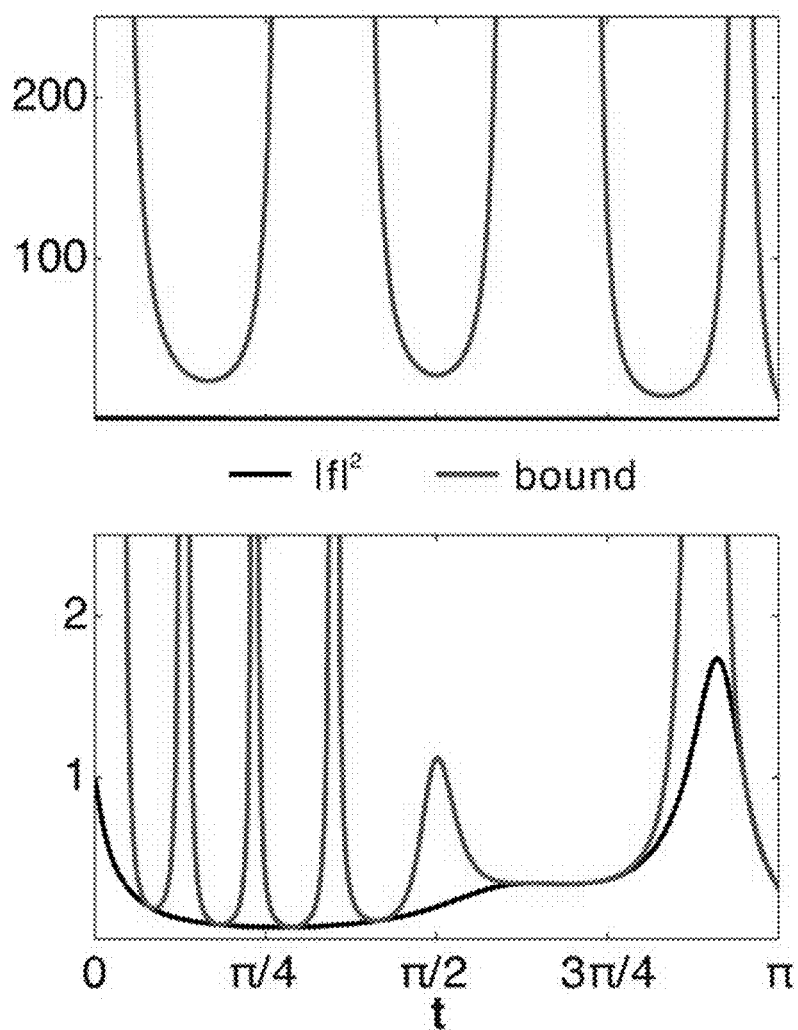
FIG. 3. The trajectory of $|f|^2$ and the corresponding bound given by the square root of the right side of equation (4) resulting from the minimum-energy control $u^*_{\pi/2}$ (top) and a quadratic control, $u(t)=(18t^2+4-9\pi^2)/8$, (bottom) that steer the spring from $X_0=(0, 0)$ to $X_{\pi/2}=(\pi/2, 0)$.

Discretizing this convex problem leads to a finite-dimensional quadratic program $$\min_U U'HU + 2U'Q \quad (70)$$

$$\text{s.t. } |u_i| \leq 1, i=1, \ldots, n, \quad (71)$$

where $U=(u1, \ldots, un)'$, $t1=0$, $tn=T$, $$H = \begin{bmatrix} \text{sinc}(t_1-t_1) & \text{sinc}(t_1-t_2) & \ldots & \text{sinc}(t_1-t_n) \\ \text{sinc}(t_2-t_1) & \text{sinc}(t_2-t_2) & \ldots & \text{sinc}(t_2-t_n) \\ \vdots & \vdots & \ddots & \vdots \\ \text{sinc}(t_n-t_1) & \text{sinc}(t_n-t_2) & \ldots & \text{sinc}(t_n-t_n) \end{bmatrix},$$

and $Q=(\text{sinc}(t1), \ldots, \text{sinc}(tn))'$ in which $\text{sinc}(x)=\sin(x)/x$. The resulting quadratic program can be effectively solved, for example, with standard gradient methods or using commercial nonlinear programming solvers, and its global optima are in a bang-bang form, which has switching characteristics between the positive and negative maximum allowable amplitude as illustrated in FIG. 3.

REFERENCES

[1] R. W. Brockett. *Finite Dimensional Linear Systems*. John Wiley and Sons, Inc., 1970.
[2] J. Cavanagh, W. J. Fairbrother, A. G. Palmer, and N. J. Skelton. *Protein NMR Spectroscopy*. Academic Press, San Diego, Calif., 1996.
[3] L. Ahifors. *Complex Analysis*. McGraw Hill, 1979.
[4] E. L. Ince. *Ordinary Differential Equations*. Dover Publications, New York, 1956.
[5] J.-S Li. Ensemble control of finite-dimensional time-varying linear system. *IEEE Transactions on Automatic Control*, 56(2):345-357, 2005.
[6] C. Flammer. *Spheroidal Wave Functions*. Stanford University Press, Stanford, Calif., 1957.
[7] D. B. Percival. *Spectral Analysis for Physical Applications*. Cambridge University Press, Cambridge, UK, 1993.
[8] D. Slepian and H. O. Pollak. Prolate spheroidal wave function, fourier analysis and uncertainly—i. *Bell System Tech. J.*, 40:43-64, 1961.
[9] D. Slepian and H. O. Pollak. Prolate spheroidal wave function, fourier analysis and uncertainly—v. *Bell System Tech. J.*, 57:1371-1430, 1978.
[10] A. Ziotnik and J.-S. Li. Synthesis of optimal ensemble controls for linear systems using the singular value decomposition. In 2012 *American Control conference*, Montreal, June 2012.

What is claimed is:

1. A method of performing broadband excitation or inversion of a two-level spin system, comprising:
   providing a two-level system comprising at least one qubit (spin) and at least one harmonic oscillator (spring);
   defining a radio frequency (RF) bandwidth for the two-level system;
   bounding a radio frequency (RF) amplitude or total energy for an RF pulse;
   determining a desired terminal magnetization profile or flip angle for the at least one spin;
   determining a desired terminal magnetization profile or flip angle for the at least one spring;
   mapping an endpoint of a trajectory of the spins to an endpoint of a trajectory of the springs, wherein the endpoints of the spins and springs correspond to the desired terminal magnetization profile or flip angle;
   employing a single control or two controls simultaneously in both an x direction and a y direction;
   calculating a converging solution for an RF pulse; or steering the spring and the spin to a desired terminal magnetization profile or flip angle by applying the calculated converging solution for the RF pulse to the two-level system.

2. The method of claim 1, wherein the calculating a converging solution comprises generating RF pulse parameters, providing a first control design comprising a minimum-energy broadband pulse, or providing a second control design comprising an amplitude-limited broadband pulse.

3. The method of claim 1, wherein
   (i) the two-level spin system is selected from the group consisting of a logical qubit spin system, a nuclear spin system, a photon spin system, an electron spin system, an atomic spin system, and a dot spin system;
   (ii) a dynamic connection between nonlinear spin and linear spring systems are calculated under optimal forcing to design an RF pulse based on the design of a control to steer linear harmonic oscillators;
   (iii) a condition of a one-to-one correspondence to a spin trajectory is satisfied;
   (iv) the RF pulse conditions result in the spins and springs having coinciding magnetization on the same axis and excitation or inversion of at least 99% of the spins and springs;
   (v) the RF pulse compensates for a distribution of spin and spring frequencies;
   (vi) the RF pulse is an excitation pulse, a reverse excitation pulse; or an inversion pulse; or
   (vii) the RF pulse results in a spin flip angle selected from $\pi$, $\pi/2$, or $\pi/4$.

4. The method of claim 1, wherein the RF pulse is computed using linear systems to force the spring.

5. The method of claim 1, wherein the RF pulse is an excitation pulse or an inversion pulse for a nonlinear Bloch system.

6. A method of constructing an RF pulse comprising:
   (i) obtaining an energy parameter;
   (ii) obtaining a bandwidth parameter;
   (iii) obtaining a desired flip angle (magnetization profile), wherein the flip angle is between 0 and 180 degrees;
   (iv) converting the desired flip angle from a spatial coordinate system to a linear coordinate system;
   (iv) inputting the energy parameter, the bandwidth parameter, and the linear coordinates into the system; or
   (v) analytically deriving parameters for the RF pulse, wherein the RF pulse produces a desired magnetization profile of a final spin or spring state.

7. The method of claim 6, wherein
the bandwidth parameter corresponds to a range of frequencies of a sample;
the method can be performed on-line; or
the method uses analytical approaches or optimization-free algorithms.

8. The method of claim 6, comprising:
providing a two-level system comprising at least one qubit (spin) and at least one harmonic oscillator (spring) and mapping the spins to the springs;
providing a first control design comprising a minimum-energy broadband pulse; or
providing a second control design comprising an amplitude-limited broadband pulse.

9. The method of claim 6, wherein the RF pulse
   (i) produces a desired distribution of final spin or spring states or a desired magnetization profile when applied to a two-level spin system;
   (ii) achieves at least 99% broadband excitation or inversion; and
   (iii) is not a hyperbolic secant pulse.

10. The method of claim 6, wherein the RF pulse
    (i) compensates for a distribution of spin and spring frequencies; or
    (ii) satisfies experimental requirements selected from a bound on an RF pulse amplitude or total energy of the RF pulse.

11. The method of claim 6, wherein the bandwidth parameter is between −40 kHz and 40 kHz.

12. The method of claim 6, wherein the energy parameter comprises a maximum allowable power in Watts or dbm.

13. The method of claim 6, wherein flip angle is between 0 and 360° or selected from a $\pi$, a $\pi/2$, or a $\pi/4$ flip angle.

14. A method of designing a broadband radiofrequency (RF) pulse comprising:
   (i) providing a two-level spin system comprising at least one qubit (spin) and at least one harmonic oscillator (spring);
   (i) employing at least a first control design and optionally, a second control design simultaneously in both an x and a y direction; or
   (ii) achieving a desired flip angle of a qubit, wherein
   the flip angle of a qubit is controlled by steering the spring between specific states.

15. The method of claim 14, wherein the qubit is selected from the group consisting of a logical qubit, a nuclear spin, a photon, an electron, an atomic spin, and a dot spin.

16. The method of claim 14, wherein the qubit is a nuclear spin and a broadband RF pulse compensates for a distribution of spin and spring frequencies.

17. The method of claim 14, further comprising numerical optimization, resulting in an RF pulse or an RF pulse sequence that places bounds on a radio-frequency (RF) amplitude or a total energy of the RF pulse.

18. The method of claim 14, wherein
the first control design comprises a minimum-energy broadband pulse; and
the second control design comprises an amplitude-limited broadband pulse;
the flip angle can be between about 0° and 360°; or
the RF pulse performs at least 99%, exact, or asymptotically exact excitation or inversion over a defined bandwidth, optionally with a bounded amplitude.

19. The method of claim 14, wherein the RF pulse has a bang-bang pulse shape.

20. The method of claim 14, wherein an excitation or inversion of the spins can be adjusted by selecting different amplitude bounds and RF pulse durations.

* * * * *